(12) United States Patent
Toguchi et al.

(10) Patent No.: US 6,329,083 B1
(45) Date of Patent: Dec. 11, 2001

(54) ORGANIC ELECTROLUMINESCENT DEVICE CONTAINING A BENZOPERYLENE COMPOUND

(75) Inventors: Satoru Toguchi; Atsushi Oda; Hitoshi Ishikawa, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/186,081

(22) Filed: Nov. 5, 1998

(30) Foreign Application Priority Data

| Nov. 5, 1997 | (JP) | 9-303047 |
|---|---|---|
| Nov. 5, 1997 | (JP) | 9-303048 |
| Dec. 25, 1997 | (JP) | 9-357022 |
| Jan. 6, 1998 | (JP) | 10-000886 |

(51) Int. Cl.$^7$ ................................................ H05B 33/12
(52) U.S. Cl. ...................... 428/690; 428/917; 313/504; 313/506
(58) Field of Search ....................... 428/690, 704, 428/917; 313/504, 506

(56) References Cited

U.S. PATENT DOCUMENTS

| 5,141,671 | * | 8/1992 | Bryan et al. ............... 252/301.16 |
| 5,409,783 | * | 4/1995 | Tang et al. ..................... 428/690 |
| 5,935,720 | * | 8/1999 | Chen et al. ..................... 428/690 |

FOREIGN PATENT DOCUMENTS

| 3-791 | 1/1991 | (JP). |
| 3-152897 | 6/1991 | (JP). |
| 3-200289 | 9/1991 | (JP). |
| 4-6795 | 1/1992 | (JP). |
| 4-334894 | 11/1992 | (JP). |
| 5-295359 | 11/1993 | (JP). |
| 6-132080 | 5/1994 | (JP). |
| 7-53955 | 2/1995 | (JP). |
| 7-138561 | 5/1995 | (JP). |
| 7-272854 | 10/1995 | (JP). |
| 7-288184 | 10/1995 | (JP). |
| 8-20771 | 1/1996 | (JP). |
| 8-40995 | 2/1996 | (JP). |
| 8-40997 | 2/1996 | (JP). |
| 8-53397 | 2/1996 | (JP). |
| 8-87122 | 4/1996 | (JP). |
| 8-199162 | 8/1996 | (JP). |
| 8-239655 | 9/1996 | (JP). |
| 8-245955 | 9/1996 | (JP). |
| 8-259935 | 10/1996 | (JP). |
| 8-286033 | 11/1996 | (JP). |
| 10-102051 | 4/1998 | (JP). |
| 10-183112 | 7/1998 | (JP). |
| 11-67450 | 3/1999 | (JP). |
| 11-97174 | 4/1999 | (JP). |

OTHER PUBLICATIONS

Japanese Office Action, dated Jun. 27, 2000, with partial English translation.
Japanese Office Action dated Oct. 14, 1999, with partial translation.
Tang, et al, "Organic electroluminescent diodes",Appl. Phys. Lett. 51 (12), Sep. 21, 1987, pp. 913–915.

* cited by examiner

*Primary Examiner*—Marie Yamnitzky
(74) *Attorney, Agent, or Firm*—McGinn & Gibb, PLLC

(57) ABSTRACT

An electroluminescent device including an anode, a cathode, and at least one organic layer sandwiched between the anode and the cathode, the organic layer including at least a light emitting layer containing a compound represented with the chemical formula C3, alone or in combination:

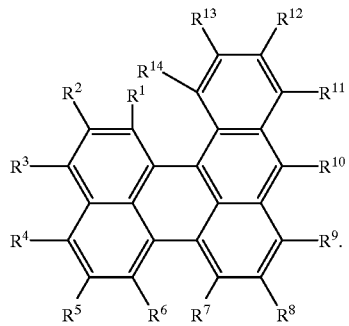

17 Claims, 1 Drawing Sheet

ORGANIC ELECTROLUMINESCENT DEVICE CONTAINING A BENZOPERYLENE COMPOUND

BACKGROUND OF THE INVENTION

1. Field of the Invention

The invention relates to an organic electroluminescent device, and more articularly to an organic electroluminescent device having improved light-mission characteristic.

2. Description of the Related Art

An organic electroluminescent device (hereinafter, referred to simply as "organic EL device") is a light-emitting device under the principle that fluorescent material performs light emission by re-combination energy generated when holes introduced through an anode and electrons introduced through a cathode are re-combined, which re-combination is caused by applying an electric field to the organic EL device.

After the organic EL device driven at a low voltage and comprised of a multi-layered structure has been reported by C. W. Tang and S. A. VanSlyke in Applied Physics Letters, Vol. 51, pp. 913, 1987, various studies have been made about an organic EL device composed of organic material. The organic EL device suggested by C. W. Tang et al. includes a light-emitting layer composed of tris-(8-hydroxyquinolinol aluminum), and a hole-transporting layer composed of triphenyl di-amine. The multi-layered structure provides advantages that holes, can be injected into a light-emitting layer with a higher efficiency, that electrons injected through a cathode can be blocked to thereby enhance a generation efficiency of excitons generated by re-combination, and that excitons generated in a light-emitting layer can be shut in the light-emitting layer.

An organic EL device generally has either a two-layered structure including a hole transporting layer and an electron transporting light-emitting layer, or a three-layered structure including a hole transporting layer, a light-emitted layer, and an electron transporting layer. Various attempts have been made about a device structure and a method of fabrication in such a multi-layered structure device in order to enhance an efficiency of re-combination of injected holes and electrons.

As suggested in Japanese Unexamined Patent Publications Nos. 8-20771, 8-40995, 8-40997, 8-259935, and 8-87122, triphenyl amine derivative and aromatic diamine derivative of star-burst molecules such as 4, 4', 4"-tris(3-methylphenylphenylamino)triphenylamine, and N,N'-diphenyl-N,N'-bis(3methylphenyl)-[1,1'-biphenyl]-4,4'-diamine, are well known as materials of which a hole transporting layer is composed.

As materials of which an electron transporting layer is composed, oxadiazole derivative, triazole derivative and so on are well known.

As materials of which a light-emitting layer is composed, chelate complex such as (8-quiolinolate)aluminum complex, coumarin derivative, tetraphenylbutadiene derivative, bis-styrylarylene derivative, and oxadiazole derivative are well known. It has been also reported that those materials emit a light in a visible range including blue to red lights. For instance, those materials are used for color display device, as suggested in Japanese Unexamined Patent Publications 8-239655, 7-138561, and 3-200289.

An organic EL device is free from a limitation that an alternative current and a high voltage have to be applied thereto, unlike an inorganic EL device. In addition, it is considered that an organic EL device could provide many colors due to variety in organic compounds, and hence, an organic EL device is expected to apply to a full-color display.

In application of an organic EL device to a full-color display, it is necessary to have light-emission of three major colors, that is, red, green and blue. Many examples have been reported about green light-emission. For instance, there has been suggested a device including aluminum complex of 8-quinolinol (Applied Physics Letters, Vol. 51, pp. 913, 1987), and a device including diarylamine derivative (Japanese Unexamined Patent Publication No. 8-53397).

There have been reported many examples of blue light emitting devices. For instance, Japanese Unexamined Patent Publications Nos. 5-295359, 7-53955, and 6-132080 have suggested a device including stilbene family compound, a device including triarylamine derivative, and a device including styrylized biphenyl compound, respectively.

Japanese Unexamined Patent Publication No. 8-245955 has suggested an organic EL device in which various light-emitting materials emitting various colored lights may be selected by using an electron transporting material having stability as a thin film, resulting in reduction in brightness.

However, there are quite few examples about an organic EL device providing red light emission. For instance, Japanese Unexamined Patent Publication 3-152897 has suggested a method of converting a wavelength of a blue light in a fluorescent pigment layer. Japanese Unexamined Patent Publications Nos. 7-272854, 7-288184, and 8-286033 have suggested red light emission accomplished by doping red fluorescent pigment into a green or blue light emitting layer. Examples of an organic EL device providing red light emission are few relative to examples of an organic EL device providing green or blue emission.

Furthermore, the above-mentioned organic EL devices providing red light emission cannot provide sufficient brightness, color purity, efficiency, and lifetime, and hence, need to be improved.

Apart from the Publications listed above, Japanese Unexamined Patent Publication No. 3-791 has suggested an electric field light-emitting device including a fluorescent light-emitting layer containing perylene compound.

Japanese Unexamined Patent Publication No. 4-6795 has suggested an organic electroluminescent device including an electrode through which electrons are injected and which has at least two-layered structure.

Japanese Unexamined Patent Publication No. 4-334894 has suggested an electric field light-emitting device including an organic thin film. The suggested electric field light-emitting device includes a layer composed of a hole transporting light-emitting material, and a layer composed of both a hole transporting light-emitting material and an electron transporting material.

SUMMARY OF THE INVENTION

It is an object of the present invention to provide an organic EL device capable of providing a higher brightness than a brightness of conventional ones.

Another object of the present invention is to provide an organic EL device capable of providing red light emission at a higher brightness and in higher color purity than those of conventional ones.

The inventors have conducted experiments in order to solve the above-mentioned problems, and it was found that an organic EL device including a light-emitting layer composed of perylene compound having diarylamino group at a particular position provides a higher brightness than a brightness of conventional organic EL devices.

It was also found that perylene compound had high hole transporting characteristic, and that both an organic EL device including a hole transporting layer composed of perylene compound, and an organic EL device including a thin film composed of perylene compound and other hole transporting materials or electron transporting materials provide light-emission with a higher brightness than that of conventional organic EL devices.

There is provided an electroluminescent device including (a) an anode, (b) a cathode, and (c) at least one organic layer sandwiched between the anode and the cathode, the organic layer including at least a light-emitting layer, the organic layer containing a compound represented with the chemical formula C1, alone or in combination:

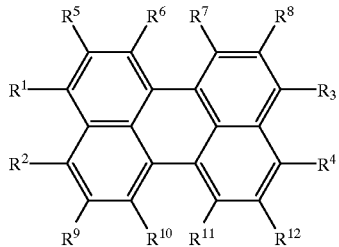

wherein $R^1$ to $R^4$ each independently represents a hydrogen atom, a hydroxyl group, a substituted or unsubstituted amino group, a nitro group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, or a substituted or unsubstituted aralkyl group, wherein at least one of $R^1$ to $R^4$ is a di-aryl amino group represented with —$NAr^1Ar^2$ where each of $Ar^1$ and $Ar^2$ independently indicates an aryl group having a carbon number of 6 to 20 both inclusive, wherein $R^5$ to $R^{12}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, or a substituted or unsubstituted aralkyl group, a substituted or unsubstituted aryloxy group, a substituted or unsubstituted alkoxycarbonyl group, or a carboxyl group, and wherein any two of $R^1$ to $R^4$ except diaryl amino group and $R^5$ to $R^{12}$ may form a ring.

It is preferable that each of the $Ar^1$ and $Ar^2$ includes a substituent.

It is preferable that the organic layer includes a hole transporting layer containing the compound represented with the chemical formula C1, alone or in combination.

The inventors have conducted experiments in order to solve the above-mentioned problems, and it was found that an organic EL device including a light-emitting layer composed of bisanthrene compound provides a higher brightness than a brightness of conventional organic EL devices.

It was also found that bisanthrene compound had high hole transporting characteristic, and that both an organic EL device including a hole transporting layer composed of bisanthrene compound, and an organic EL device including a thin film composed of bisanthrene compound and other hole transporting materials or electron transporting materials provide light-emission with a higher brightness than that of conventional organic EL devices.

There is further provided an electroluminescent device including (a) an anode, (b) a cathode, and (c) at least one organic layer sandwiched between the anode and the cathode, the organic layer including at least a light-emitting layer, the organic layer containing a bisanthrene compound represented with the chemical formula C2, alone or in combination:

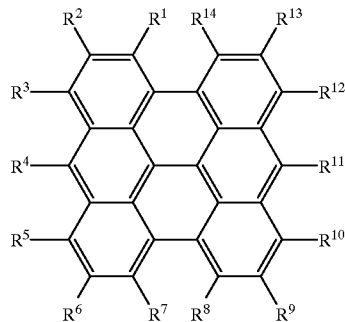

wherein $R^1$ to $R^{14}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group, and wherein any two of $R^1$ to $R^{14}$ may form a ring.

It is preferable that the organic layer includes a hole or electron transporting layer containing the compound represented with the chemical formula C2, alone or in combination. It is also preferable that the organic layer includes both a hole transporting layer and an electron transporting layer, the electron transporting layer containing the compound represented with the chemical formula C2, alone or in combination.

It was also found that an organic EL device including a light-emitting layer composed of a particular benzoperylene compound emit a light at a higher brightness than a brightness of conventional organic EL devices.

It was also found that the above-mentioned benzoperylene compound had high carrier transporting characteristic, and that both an organic EL device including a hole or electron transporting layer composed of the benzoperylene compound, and an organic EL device including a thin film composed of the benzoperylene compound and other hole transporting materials or electron transporting materials provide light-emission with a higher brightness than that of conventional organic EL devices.

It was also found that an organic EL device including in particular a diarylamino group as a substituent among benzoperylene compounds provides light-emission with a higher brightness.

It was further found that an organic EL device including in particular an aryl group having a styryl group as a substituent, among benzoperylene compounds having a diarylamino group as a substituent provides light-emission with a higher brightness.

There is still further provided an electroluminescent device including a) an anode, (b) a cathode, and (c) at least one organic layer sandwiched between the anode and the cathode, the organic layer including at least a light-emitting layer, the organic layer containing a benzoperylene compound represented with the chemical formula C3, alone or in combination:

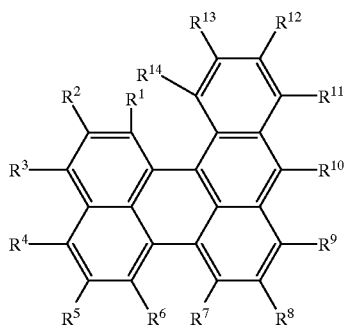

wherein $R^1$ to $R^{14}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocylic group, a substituted or unsubstituted aralkyl group, a substituted or unsubstituted aryloxy group, a substituted or unsubstituted alkoxycarbonyl group, or a carboxyl group, and wherein any two of $R^1$ to $R^{14}$ may form a ring.

It is preferable that the organic layer includes a hole or electron transporting layer containing the benzoperylene compound represented with the chemical formula C3, alone or in combination.

It is preferable that at least one of $R^1$ to $R^{14}$ is a di-aryl amino group represented with —$NAr^1Ar^2$ where each of $Ar^1$ and $Ar^2$ independently indicates an aryl group having a carbon number of 6 to 20 both inclusive, in which case, the aryl group may have a substituent.

It is also preferable that at least one of $R^1$ to $R^{14}$ is a di-aryl amino group represented with —$NAr^1Ar^2$ where each of $Ar^1$ and $Ar^2$ independently indicates an aryl group having a carbon number of 6 to 20 both inclusive, and at least one of the $Ar^1$ and $Ar^2$ includes a substituted or unsubstituted styryl group as a substituent, in which case, the aryl group may have a substituent.

It was also found that an organic EL device including a light-emitting layer composed of a particular terylene compound emit a light at a higher brightness than a brightness of conventional organic EL devices.

It was also found that the above-mentioned terylene compound had high carrier transporting characteristic, and that both an organic EL device including a hole or electron transporting layer composed of the terylene compound, and an organic EL device including a thin film composed of the terylene compound and other hole transporting materials or electron transporting materials provide light-emission with a higher brightness than that of conventional organic EL devices.

It was also found that an organic EL device including in particular a diarylamino group as a substituent among terylene compounds provides light-emission with a higher brightness.

It was further found that an organic EL device including in particular an aryl group having a styryl group as a substituent, among terylene compounds having a diarylamino group as a substituent provides light-emission with a higher brightness.

There is yet further provided an electroluminescent device including (a) an anode, (b) a cathode, and (c) at least one organic layer sandwiched between the anode and the cathode, the organic layer including at least a light-emitting layer, the organic layer containing a terylene compound represented with the chemical formula C4, alone or in combination:

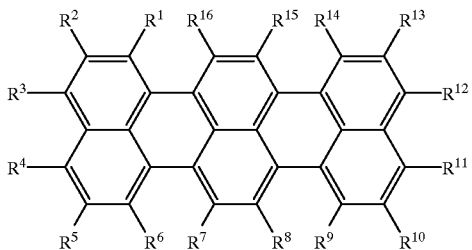

wherein $R^1$ to $R^{16}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group, and wherein any two of $R^1$ to $R^{16}$ may form a ring.

It is preferable that the organic layer includes a hole or electron transporting layer containing the terylene compound represented with the chemical formula C4, alone or in combination.

It is preferable that at least one of $R^1$ to $R^{14}$ is a di-aryl amino group represented with —$NAR^1Ar^2$ where each of $Ar^1$ and $Ar^2$ independently indicates an aryl group having a carbon number of 6 to 20 both inclusive, in which case, the aryl group may have a substituent.

It is preferable that at least one of $R^1$ to $R^{14}$ is a di-aryl amino group represented with —$NAR^1Ar^2$ where each of $Ar^1$ and $Ar^2$ independently indicates an aryl group having a carbon number of 6 to 20 both inclusive, and at least one of the $Ar^1$ and $Ar^2$ includes a substituted or unsubstituted styryl group as a substituent, in which case, the aryl group may have a substituent.

It is preferable that the anode has a work function equal to or greater than 4.5 eV, in which case, it is preferable that the cathode has a smaller work function than that of the anode.

It is preferable that the organic layer has a thickness in the range of 1 nanometer to 1 micrometer both inclusive.

The firstly mentioned organic EL device includes a compound having a chemical constitution represented with the chemical formula C1. In the chemical formula C1, $R^1$ to $R^4$ each independently represents a hydrogen atom, a hydroxyl group, a substituted or unsubstituted amino group, a nitro group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, or a substituted or unsubstituted aralkyl group. At least one of $R^1$ to $R^4$ is a di-aryl amino group represented with $-NAR^1Ar^2$ where each of $Ar^1$ and $Ar^2$ independently indicates an aryl group having a carbon number of 6 to 20 both inclusive. In the chemical formula C1, $R^5$ to $R^{12}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, or a substituted or unsubstituted aralkyl group, a substituted or unsubstituted aryloxy group, a substituted or unsubstituted alkoxycarbonyl group, or a carboxyl group.

The secondly mentioned organic EL device includes a compound having a chemical constitution represented with the chemical formula C2. In the chemical formula C2, $R^1$ to $R^{14}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group.

The thirdly mentioned organic EL device includes a compound having a chemical constitution represented with the chemical formula C3. In the chemical formula C3, $R^1$ to $R^{14}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group.

The fourthly mentioned organic EL device includes a compound having a chemical constitution represented with the chemical formula C4. In the chemical formula C4, $R^1$ to $R^{14}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group.

The halogen atom includes fluorine, chlorine, bromine, and iodine.

The substituted or unsubstituted amino group is represented by $-NX^1X^2$ wherein $X^1$ and $X^2$ each independently represent a hydrogen atom, a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-triburomopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 12-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 4-styrylphenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terpheny-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a 2-pyrrolyl group, a 3-pyrrolyl group, a pyrazinyl group, a 2-pyridinyl group, a 3-pyridinyl group, a 4-pyridinyl group, a 2-indolyl group, a 3-indolyl group, a 4-indolyl group, a 5-indolyl group, a 6-indolyl group, a 7-indolyl group, a 1-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-benzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinoly group, a 7-isoquinolyl group, a 8-isoquinolyl group, a 2-quinoxalyl group, a 5-quinoxalyl group, a 6-quinoxalyl group, a 1-carbazolyl group, a 2-carbazolyl group, a 3-carbazolyl group, a 4-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acrydinyl group, a 2-acrydinyl group, a 3-acrydinyl group, a 4-acrydinyl group, a 9-acrydinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenazinyl group, a 2-phenazinyl group, a 1-phenothiazinyl group, a 2-phenothiazinyl group, a 3-phenothiazinyl group, a 4-phenothiazinyl group, a 1-phenoxazinyl group, a 2-phenoxazinyl group, a 3-phenoxazinyl group, a 4-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, or the like.

The substituted or unsubstituted alkyl group includes, for example, a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-buty group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, and a 1,2,3-trinitropropyl group.

The substituted or unsubstituted alkenyl group includes, for example, a vinyl group, an allyl group, a 1-butenyl group, a 2-butenyl group, a 3-butenyl group, a 1,3-butadienyl group, a 1-methylvinyl group, a styryl group, a 2,2-diphenylvinyl group, a 1,2-diphenylvinyl group, a 1-methylally group, a 1,1-dimethylallyl group, a 2-methylally group, a 1-phenylally group, a 2-phenylallyl group, a 3-phenylally group, a 3,3-diphenylally group, a 1,2-dimethylally group, a 1-phenyl-1-butenyl group, and a 3-phenyl-1-butenyl group.

The substituted or unsubstituted cycloalkyl group includes, for example, a cyclopropyl group, a cyclobutyl group, a cyclopentyl group, a cyclohexyl group, and a 4-methylcyclohexyl group.

The substituted or unsubstituted alkoxy group is a group represented by —OY wherein Y represents, for example, a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethy group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, and a 1,2,3-trinitropropyl group.

The substituted or unsubstituted aromatic hydrocarbon group includes, for example, a phenyl group, a 1-naphthyl group, a 2-naphthyl group, a 1-anthryl group, a 2-anthryl group, a 9-anthryl group, a 1-phenanthryl group, a 2-phenanthryl group, a 3-phenantryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terpheny-3-yl group, an m-terphenyl-2-yl group, an m-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4"-t-butyl-p-terphenyl-4-yl group.

Further, the substituted or unsubstituted aromatic heterocyclic group includes, for example, a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-benzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalyl group, a 5-quinoxalyl group, a 6-quinoxalyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acrydinyl group, a 2-acrydinyl group, a 3-acrydinyl group, a 4-acrydinyl group, a 9-acrydinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

The substituted or unsubstituted aralkyl group includes, for example, a benzyl group, a 1-phenylethyl group, a 2-phenylethyl group, a 2-phenyl isopropyl group, a phenyl-t-butyl group, an a-naphthylmethyl group, a 1-a-naphthylethyl group, a 2-a-naphthylethyl group, a 1-a-naphthylisopropyl group, a 2-a-naphthylisopropyl group, a b-naphthylmethyl group, a 1-b-naphthylethyl group, a 2-b-naphthylethyl group, a 1-b-naphthylisopropyl group, a 2-b-naphthylisopropy group, a 1-pyrrolylmethyl group, a 2-(1-pyrrolyl)ethyl group, a p-methylbenzy group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, and a 1-chloro-2-phenylisopropyl group.

The substituted or unsubstituted aryloxy group is represented by —OZ wherein Z represents a phenyl group, a 1-naphthyl group, a 2-napithyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terpheny-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a 2-pyrrolyl group, a 3-pyrrolyl group, a pyrazinyl group, a 2-pyridinyl group, a 3-pyridinyl group, a 4-pyridinyl group, a 2-indolyl group, a 3-indolyl group, a 4-indolyl group, a 5-indolyl group, a 6-indolyl group, a 7-indoly group, a 1-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-benzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalyl group, a 5-quinoxalyl group, a 6-quinoxalyl group, a 1-carbazolyl group, a 2-carbazolyl group, a 3-carbazolyl group, a 4-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acrydinyl group, a 2-acrydinyl group, a 3-acrydinyl group, a 4-acrydinyl group, a 9-acrydinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenazinyl group, a 2-phenazinyl group, a 1-phenothiazinyl group, a 2-phenothiazinyl group, a 3-phenothiazinyl group, a 4-phenothiazinyl group, a 1-phenoxazinyl group, a 2-phenoxazinyl group, a 3-phenoxazinyl group, a 4-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, or the like.

The substituted or unsubstituted alkoxycarbonyl group is represented by —COOY wherein Y represents a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-triburomopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, or the like.

Further, the bivalent group that forms a ring includes, for instance, a tetramethylene group, a pentamethylene group, a hexamethylene group, a diphenylmethan-2,2-diyl group, a diphenylethan-3,3'-diyl group, and a diphenylpropan-4,4'-diyl group.

An aryl group having the carbon number in the range of 6 to 20 both inclusive includes, for instance, a phenyl group, a naphthyl group, an antoryl group, a phenanthryl group, a naphthasenyl group, and a pyrenyl group.

A substituent of an aryl group includes, for instance, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group.

A styryl group as a substituent of $Ar^1$ and $Ar^2$ includes, for instance, an unsubstituted styryl group, 2,2-diphenylvinyl group. A substituent of the terminal phenyl group includes, for instance, a substituted styryl group and a substituted 2,2-diphenyvinyl group including a halogen atom, a hydroxyl group, a substituted or unsubstituted amino group, a nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group.

Hereinbelow are shown examples of a compound represented with the above-mentioned chemical formula C1 constituting an organic EL device in accordance with the present invention. However, it should be noted that a compound represented with the chemical formula C1 is not to be limited to the examples shown hereinbelow.

(X1)

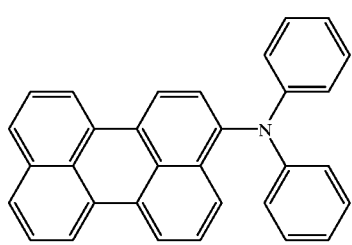

(Y1)

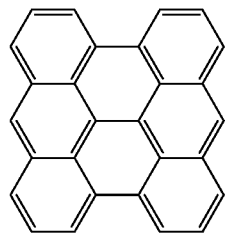

(X2)

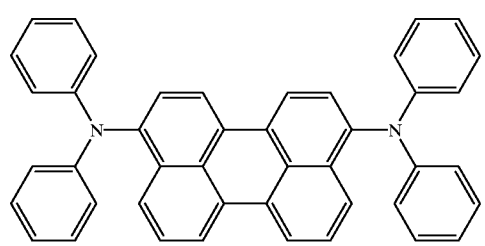

(Y2)

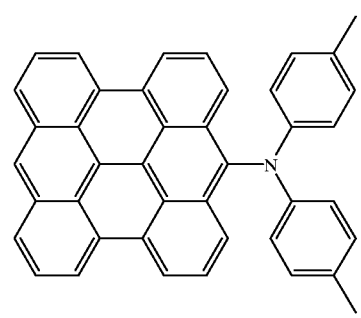

(X3)

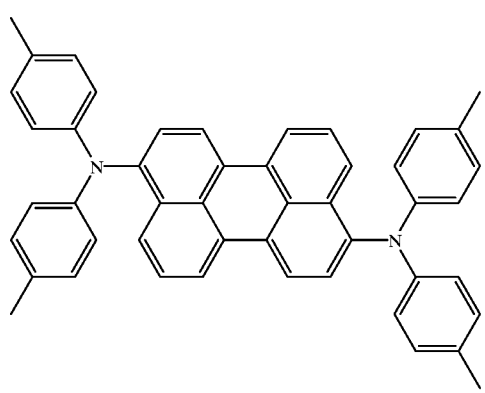

(Y3)

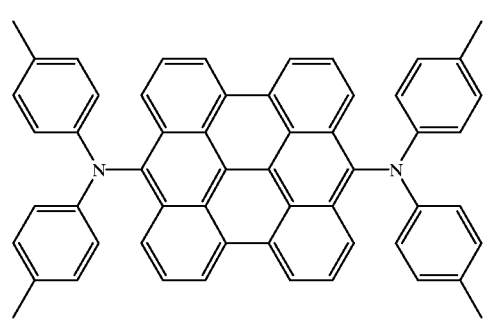

(Y4)

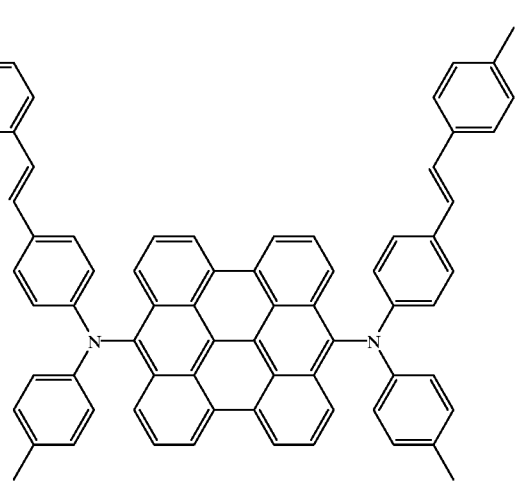

Hereinbelow are shown examples of a compound represented with the above-mentioned chemical formula C2 constituting an organic EL device in accordance with the present invention. However, it should be noted that a compound represented with the chemical formula C2 is not to be limited to the examples shown hereinbelow.

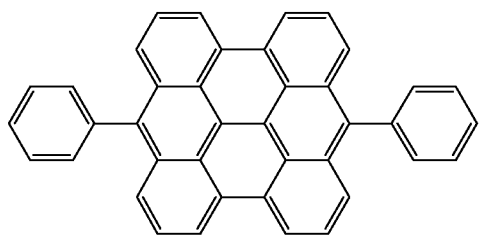
(Y5)

Hereinbelow are shown examples of a benzoperylene compound represented with the above-mentioned chemical formula C3 constituting an organic EL device in accordance with the present invention. However, it should be noted that a benzoperylene compound represented with the chemical formula C3 is not to be limited to the examples shown hereinbelow.

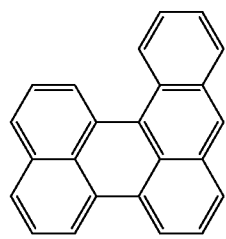
(Z1)

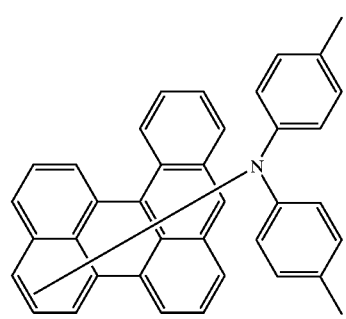
(Z2)

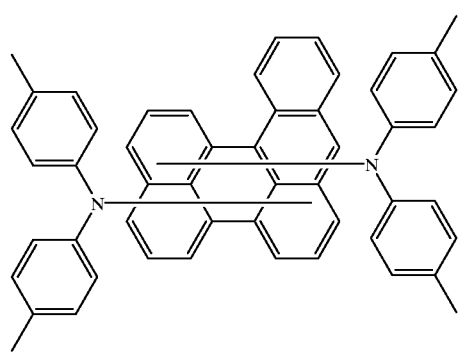
(Z3)

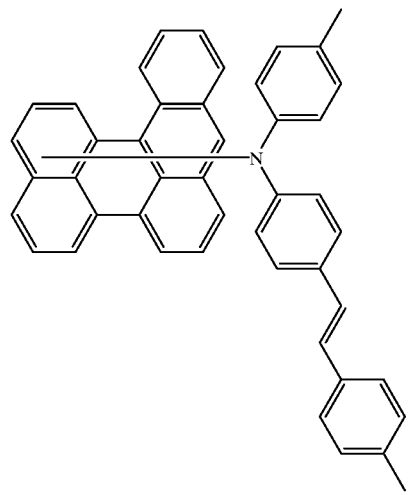
(Z4)

(Z5)

Hereinbelow are shown examples of a compound represented with the above-mentioned chemical formula C4 constituting an organic EL device in accordance with the present invention. However, it should be noted that a compound represented with the chemical formula C4 is not to be limited to the examples shown hereinbelow.

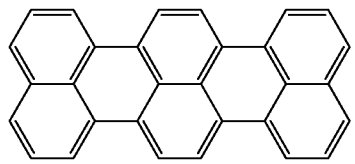
(W1)

(W2)
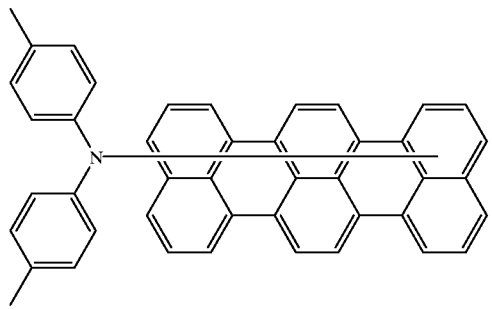

(W3)
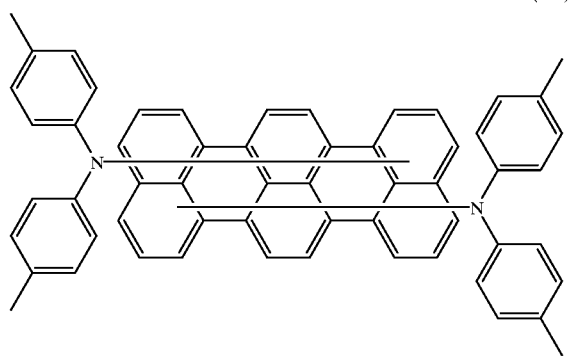

(W4)
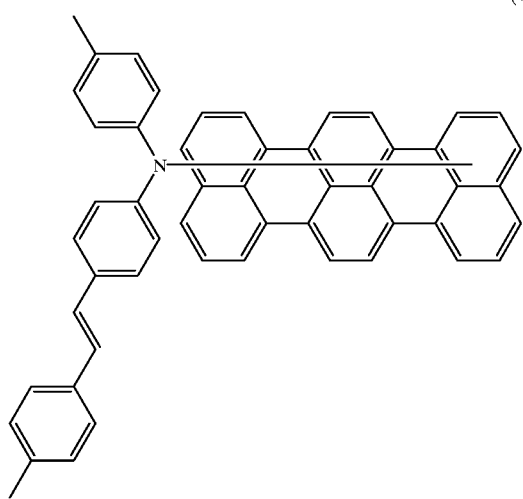

(W5)
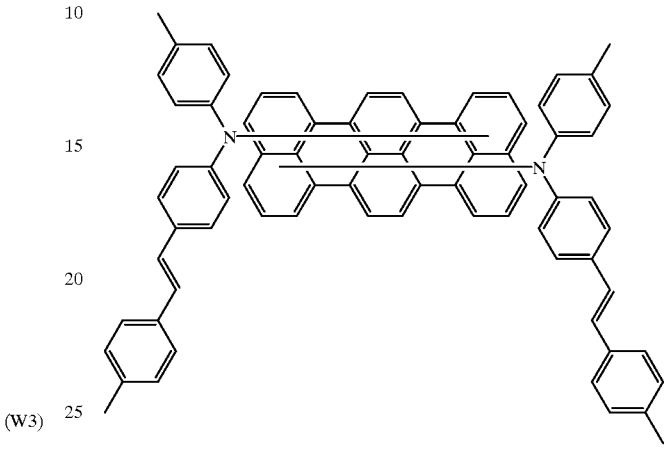

An organic EL device in accordance with the present invention includes an anode, a cathode, and one or more organic thin layer(s) sandwiched between the anode and the cathode. Specifically, the organic EL device may be comprised of:

(A) an anode 2, a light-emitting layer 4, and a cathode 6 as illustrated in FIG. 1;

(B) an anode 2, a hole transporting layer 3, a light-emitting layer 4, an electron transporting layer 5, and a cathode 6 as illustrated in FIG. 2;

(C) an anode 2, a light-emitting layer 4, an electron transporting layer 5, and a cathode 6 as illustrated in FIG. 3; or (D) an anode 2, a hole transporting layer 3, a light-emitting layer 4, and a cathode 6 as illustrated in FIG. 4.

The chemical compounds represented with C1, C2, C3 and C4 may be contained in any one of the above-mentioned light-emitting layer, hole transporting layer, and electron transporting layer. As an alternative, the chemical compounds represented with C1, C2, C3 and C4 may be doped into other hole transporting materials, light-emitting materials, or electron transporting materials.

A material of which a hole transporting layer constituting an organic: EL device in accordance with the present invention is composed is not limited to a particular one. Any compound may be used, if it is usually used as a hole transporting material.

For instance, the compounds represented with the following chemical formulas [1] to [6] may be employed as a material of which a hole transporting layer is composed: triphenyl diamine such as bis(di(p-tlyl)aminophenyl)-1,1'-cyclohexane [01], N,N'-diphenyl-N,N'-bis(3-methylphenyl)-1,1'-biphenyl-4,4'-diamine [02], and N,N'-diphenyl-N-N-bis(1-naphthyl)-1,1'-biphenyl-4,4'-diamine [03]; and star-burst type molecules [04] to [06].

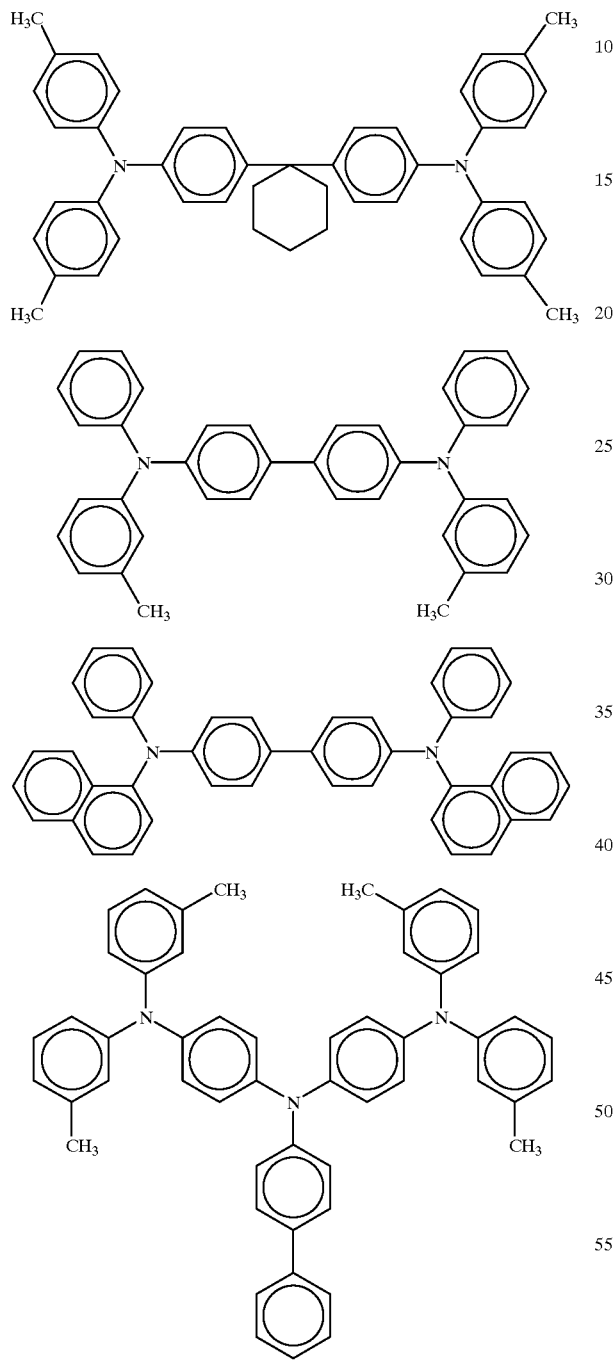

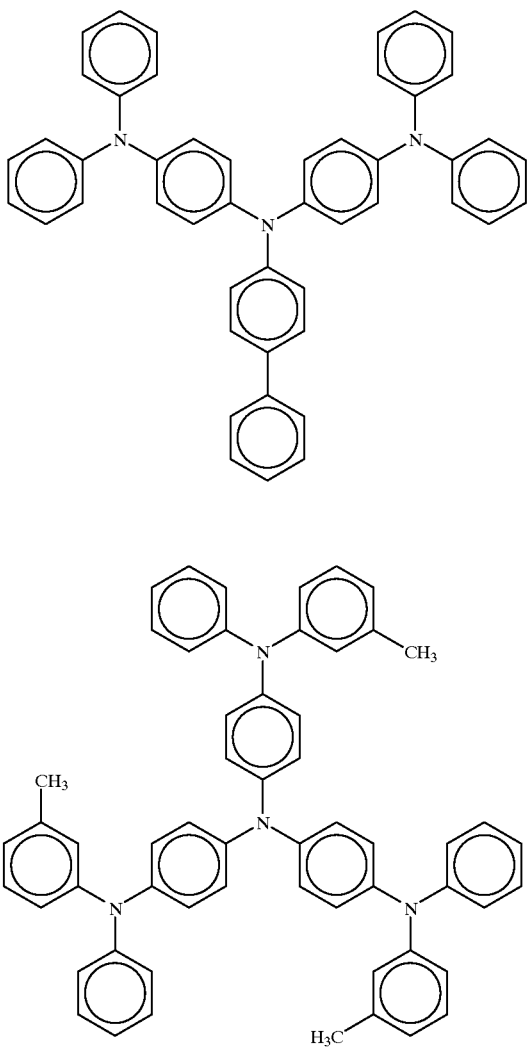

A material of which an electron transporting layer constituting an organic EL device in accordance with the present invention is composed is not limited to a particular one. Any compound may be used, if it is usually used as an electron transporting material.

For instance, the compounds represented with the following chemical formulas [7] to [14] may be employed as a material of which an electron transporting layer is composed: an oxadiazole derivative such as 2-(4-biphenyl)-5-(4-t-butylphenyl)-1,3,4-oxadiazole [07] and bis{2-(4-t-butylphenyl)-1,3,4-oxadiazole}-m-phenylene [08]; a triazole derivative [09] or [10]; or quinolinol family metal complexes [11] to [14].

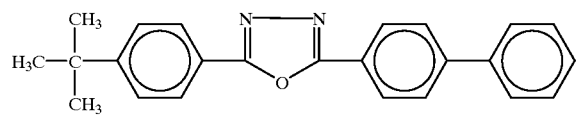
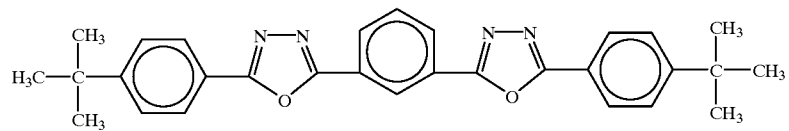
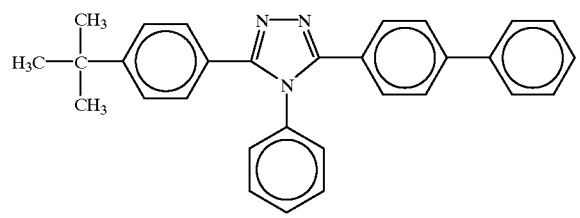
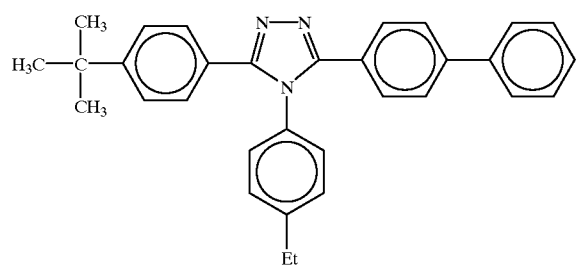
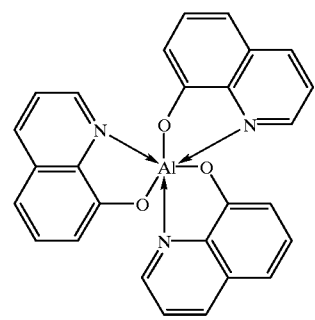
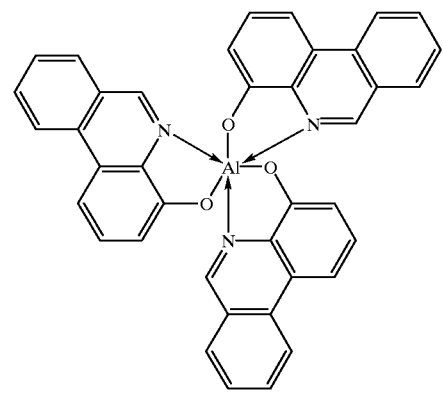

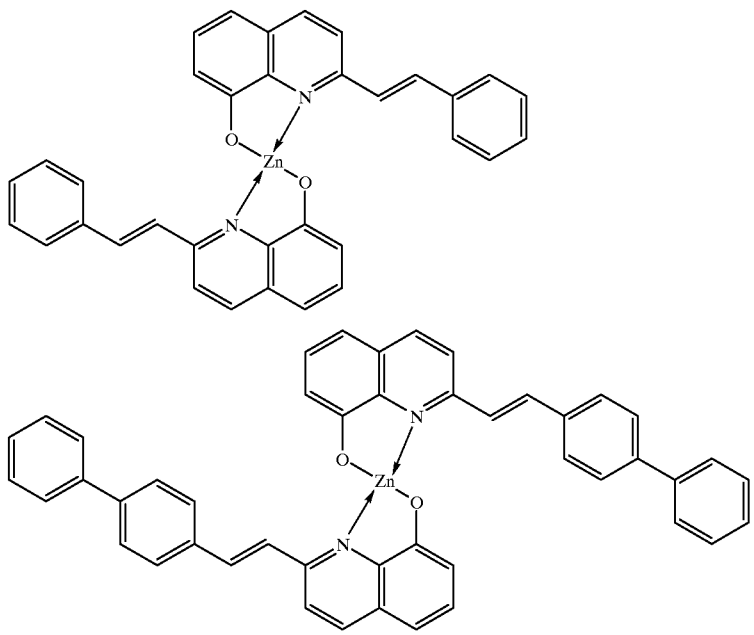

An anode of an organic thin film EL device injects holes into a hole transporting layer, and hence, it is preferable that a hole transporting layer has EL work function equal to or greater than 4.5 eV. For example, an anode of an organic EL device in accordance with the present invention is composed of indium oxide-tin alloy (ITO), tin oxide (NESA), gold, silver, platinum, or copper.

A cathode of an organic EL device injects electrons into an electron transporting layer and a light-emitting layer, and hence, it is preferable that a cathode has a smaller work function than that of an anode. A material of which a cathode is composed in an organic EL device in accordance with the present invention is not limited to a particular one. For instance, a material of which a cathode is composed includes indium, aluminum, magnesium, magnesium-indium alloy, magnesium-aluminum alloy, aluminum-lithium alloy, aluminum-scandium-lithium alloy, and magnesium-silver alloy.

Layers constituting an organic EL device in accordance with the present invention may be formed by any processes. For instance, a process such as conventional vacuum evaporation and spin coating may be employed. A thin organic layer including a compound represented with the above-mentioned chemical formulas C1, C2, C3 or C4 may be formed by conventional vacuum evaporation, molecular beam epitaxy (MBE), dipping into a solution in which a solvent is dissolved, spin coating, casting, bar coating, or roll coating.

A thickness of organic layers constituting an organic EL device in accordance with the present invention is not limited to a particular one. In general, a too small thickness of an organic layer would cause a defect such as pin-hole. On the contrary, a too great thickness of an organic layer would require a high voltage to be applied to an organic EL device, which would cause a problem of reduction in efficiency. Hence, it is preferable that each of organic layers in an organic EL device in accordance with the present invention has a thickness in the range of 1 nm to 1 μm both inclusive.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
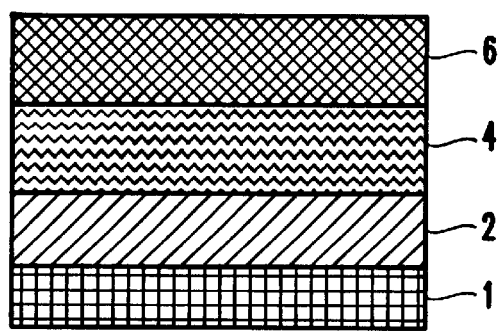
FIG. 1 is a cross-sectional view of an organic EL device in accordance with an embodiment of the present invention.

Hereinbelow are explained embodiments of an organic EL device including an organic layer containing a compound represented with the chemical formula C1.

SYNTHESIS EXAMPLE 1

Synthesis of Compound X1 (3-diphenylaminoperylene)

The following compounds were introduced into a vessel: (a) 3-bromoperylene; (b) diphenylamine; (c) potassium carbonate; (d) copper power; and (e) nitrobenzene. Then, the mixture was stirred at 200 degrees centigrade for 40 hours. After reaction has finished, nitrobenzene was removed under a reduced pressure. Then, chloroform was added to the mixture, and filtered for removing inorganic materials. A filtrate was condensed, and then, impurities were removed by silica gel column chromatography employing ligroin. As a result, there was obtained a target material, 3-diphenylaminoperylene.

SYNTHESIS EXAMPLE 2

2 Synthesis of Compound X2 (3,10-bisdiphenyl aminoperylene)

The same process as the process carried out in Synthesis Example 1 was carried out except that 3,10-dibromoperylene was used in place of 3-bromoperylene. Thus, there was obtained a target material, 3,10-bisdiphenylaminoperylene.

SYNTHESIS EXAMPLE 3

Synthesis of Compound X3 (3,9-bis(di-p-tolylamino)perylene)

The same process as the process carried out in Synthesis Example 1 was carried out except that 3,9-dichloroperylene was used in place of 3-bromoperylene, and that di-p-tolylamine was used in place of diphenylamine. Thus, there was obtained a target material, 3,9-bis(di-p-tolylamino) perylene.

In the later mentioned embodiments 1 to 3, a red light emitting layer includes the compound represented with the chemical formula C1. In the embodiments 4 to 7, a red light emitting layer includes a thin film composed of both the compound represented with the chemical formula C1 and a hole transporting material. In the embodiments 8 to 10, a red light emitting layer includes a thin film composed of both the compound represented with the chemical formula C1 and an electron transporting material. In the embodiments 11 to 13, a hole transporting layer includes the compound represented with the chemical formula C1.

[Embodiment 1]

An organic EL device in accordance with the embodiment 1 has a cross-section as illustrated in FIG. 1. That is, the organic EL device in accordance with the embodiment 1 is comprised of a glass substrate 1, an anode 2 and a cathode 6 formed on the glass substrate 1, and a red light emitting layer 4 sandwiched between the anode 2 and the cathode 6.

The organic EL device in accordance with the embodiment 1 was fabricated in the following steps. First, an ITO film was formed on the glass substrate 1 by sputtering so that the ITO film has a sheet resistance of 20 ohms per a unit area. The thus formed ITO film acted as the anode 2. Then, the red light emitting layer 4 composed of the above-mentioned compound X1 was formed on the anode 2 by a thickness of 40 nm by vacuum evaporation. Then, a magnesium-silver alloy film was formed as the cathode 6 on the red light emitting layer 4 by a thickness of 200 nm by vacuum evaporation. Thus, there was completed the organic EL device in accordance with the embodiment 1.

A direct current voltage of 5V was applied across the anode 2 and the cathode 6 of the thus fabricated organic EL device. As a result, there was obtained red light-emission of 100 cd/m$^2$.

[Embodiment 2]

The same steps as the steps carried out in the above-mentioned embodiment 1 were carried out except that the red light emitting layer 4 was composed of the compound X2, to thereby fabricate an organic EL device in accordance with embodiment 2.

A direct current voltage of 5V was applied across the anode 2 and the cathode 6 of the thus fabricated organic EL device. As a result, there was obtained red light-emission of 200 cd/m$^2$.

[Embodiment 3]

An organic EL device in accordance with the embodiment 3 has the same cross-section as that of the organic EL device in accordance with the embodiment 1, illustrated in FIG. 1. Hereinbelow is explained steps of fabricating an organic EL device in accordance with the embodiment 3.

First, an ITO film was formed on the glass substrate 1 by sputtering so that the ITO film has a sheet resistance of 20 ohms per a unit area. The thus formed ITO film acted as the anode 2. Then, the red light emitting layer 4 was formed on the anode 2 by a thickness of 40 nm by spin coating in which chloroform solution containing the above-mentioned compound X3 dissolved therein was used. Then, a magnesium-silver alloy film was formed as the cathode 6 on the red light emitting layer 4 by a thickness of 200 nm by vacuum evaporation. Thus, there was completed the organic EL device in accordance with the embodiment 3.

A direct current voltage of 5V was applied across the anode 2 and the cathode 6 of the thus fabricated organic EL device. As a result, there was obtained red light-emission of 180 cd/m$^2$.

[Embodiment 4]

Figure 2:
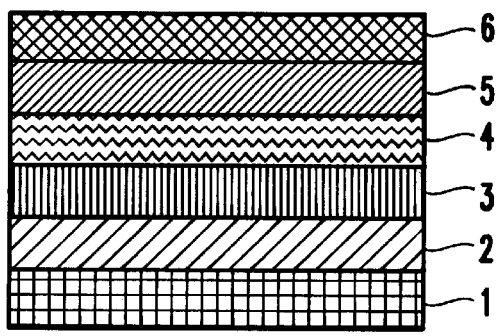
FIG. 2 is a cross-sectional view of an organic EL device in accordance with another embodiment of the present invention.

FIG. 2 illustrates a cross-section of an organic EL device in accordance with the embodiment 4. The organic EL device in accordance with the embodiment 4 is comprised of a glass substrate 1, an anode 2 and a cathode 6 both formed on the glass substrate 1, and a hole transporting layer 3, a red light emitting layer 4, and an electron transporting layer 5 all sandwiched between the anode 2 and the cathode 6.

The organic EL device in accordance with the embodiment 4 was fabricated in the following steps. First, an ITO film was formed on the glass substrate 1 by sputtering so that the ITO film has a sheet resistance of 20 ohms per a unit area. The thus formed ITO film acted as the anode 2. Then, a film composed of N,N'-diphenyl-N,N'-bis(3-methylphenyl)-1,1'-biphenyl-4,4'-diamine [02] was formed as the hole transporting layer 3 on the anode 2 by a thickness of 50 nm by vacuum evaporation. Then, the red light emitting layer 4 composed of the above-mentioned compound X1 was formed on the hole gransporting layer 3 by a thickness of 40 nm by vacuum evaporation. Then, a film composed of 2-(4-biphenyl)-5-(4-t-butylphenyl)-1,3,4-oxadiazole [07] was formed as the electron transporting layer 5 on the red light emitting layer 4 by a thickness of 20 nm by vacuum evaporation. Then, a film composed of magnesium-silver alloy was formed as the cathode 6 on the electron transporting layer 5 by a thickness of 200 nm by vacuum evaporation. Thus, there was completed the organic EL device in accordance with the embodiment 4.

A direct current voltage of 10V was applied across the anode 2 and the cathode 6 of the thus fabricated organic EL device. As a result, there was obtained red light-emission of 970 cd/m$^2$.

[Embodiment 5]

The same steps as the steps carried out in the above-mentioned embodiment 4 were carried out except that the red light emitting layer 4 was composed of the compound X2, to thereby fabricate an organic EL device in accordance with embodiment 5.

A direct current voltage of 10V was applied across the anode 2 and the cathode 6 of the thus fabricated organic EL device. As a result, there was obtained red light-emission of 1050 cd/m$^2$.

[Embodiment 6]

The same steps as the steps carried out in the above-mentioned embodiment 4 were carried out except that the red light emitting layer 4 was composed of the compound X3, that the hole transporting layer 3 was composed of N,N'-diphenyl-N-N-bis(1-naphthyl)-1,1'-biphenyl-4,4'-diamine [03], and that the electron transporting layer 5 was composed of bis{2-(4-t-butylphenyl)-1,3,4-oxadiazole}-m-phenylene [08], to thereby fabricate an organic EL device in accordance with embodiment 6.

A direct current voltage of 10V was applied across the anode 2 and the cathode 6 of the thus fabricated organic EL device. As a result, there was obtained red light-emission of 1400 cd/m$^2$.

[Embodiment 7]

The same steps as the steps carried out in the above-mentioned embodiment 4 were carried out except that the hole transporting layer 3 was composed of the above-mentioned star burst type molecules [04], that the red light emitting layer 4 was composed of the compound X3, and that the electron transporting layer 5 was composed of the above-mentioned quinolinol family metal complex [11], to thereby fabricate an organic EL device in accordance with embodiment 6.

A direct current voltage of 10V was applied across the anode 2 and the cathode 6 of the thus fabricated organic EL device. As a result, there was obtained red light-emission of 2000 cd/m$^2$.

[Embodiment 8]

Figure 3:
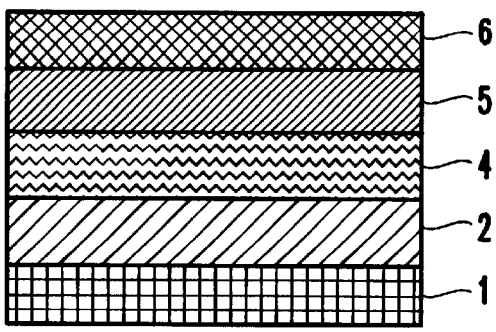
FIG. 3 is a cross-sectional view of an organic EL device in accordance with still another embodiment of the present invention.

FIG. 3 illustrates a cross-section of an organic EL device in accordance with the embodiment 8. The organic EL device in accordance with the embodiment 8 is comprised of a glass substrate 1, an anode 2 and a cathode 6 both formed on the glass substrate 1, and a red light emitting layer 4 and an electron transporting layer 5 both sandwiched between the anode 2 and the cathode 6.

The organic EL device in accordance with the embodiment 8 was fabricated in the following steps. First, an ITO film was formed on the glass substrate 1 by sputtering so that the ITO film has a sheet resistance of 20 ohms per a unit area. The thus formed ITO film acted as the anode 2. Then, a thin film was formed as the red light emitting layer 4 on the anode 2 by a thickness of 50 nm by co-evaporation. This thin film was composed of both N,N'-diphenyl-N-N-bis(1-naphthyl)-1'-biphenyl-4,4'-diamine [03] and the above-mentioned compound X2 at a weight ratio of 1:10. Then, a film composed of triazole derivative [09] was formed as the electron transporting layer 5 on the red light emitting layer 4 by a thickness of 50 nm by vacuum evaporation. Then, a magnesium-silver alloy film was formed as the cathode 6 on the electron transporting layer 5 by a thickness of 200 nm by vacuum evaporation. Thus, there was completed the organic EL device in accordance with the embodiment 8.

A direct current voltage of 10V was applied across the anode 2 and the cathode 6 of the thus fabricated organic EL device. As a result, there was obtained red light-emission of 1030 cd/m$^2$.

[Embodiment 9]

The same steps as the steps carried out in the above-mentioned embodiment 8 were carried out except that the above-mentioned compound X3 was used in place of the compound X2, to thereby fabricate an organic EL device in accordance with embodiment 9.

A direct current voltage of 10V was applied across the anode 2 and the cathode 6 of the thus fabricated organic EL device. As a result, there was obtained red light-emission of 1620 cd/M$^2$.

[Embodiment 10]

An organic EL device in accordance with the embodiment 10 has the same cross-section as that of the organic EL device in accordance with the embodiment 8, illustrated in FIG. 3. Hereinbelow is explained steps of fabricating an organic EL device in accordance with the embodiment 10.

First, an ITO film was formed on the glass substrate 1 by sputtering so that the ITO film has a sheet resistance of 20 ohms per a unit area. The thus formed ITO film acted as the anode 2. Then, a thin film was formed as the red light emitting layer 4 on the anode 2 by a thickness of 40 nm by spin coating in which there was used chloroform solution containing the compound X3 and N,N'-diphenyl-N-N-bis(1-naphthyl)-1,1'-biphenyl-4,4-diamine [03] at a mol ratio of 1:10. Then, a film composed of triazole derivative [10] was formed as the electron transporting layer 5 on the red light emitting layer 4 by a thickness of 50 nm by vacuum evaporation. Then, a magnesium-silver alloy film was formed as the cathode 6 on the electron transporting layer 5 by a thickness of 200 nm by vacuum evaporation. Thus, there was completed the organic EL device in accordance with the embodiment 10.

A direct current voltage of 10V was applied across the anode 2 and the cathode 6 of the thus fabricated organic EL device. As a result, there was obtained red light-emission of 870 cd/m$^2$.

[Embodiment 11]

Figure 4:
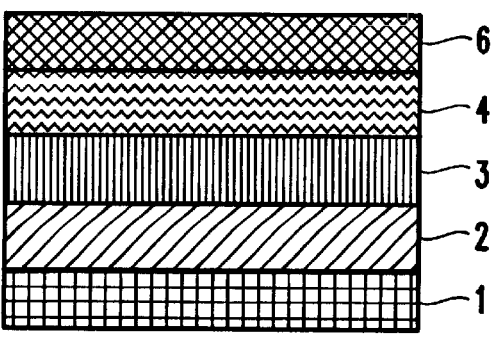
FIG. 4 is a cross-sectional view of an organic EL device in accordance with yet another embodiment of the present invention.

FIG. 4 illustrates a cross-section of an organic EL device in accordance with the embodiment 11. The organic EL device in accordance with the embodiment 11 is comprised of a glass substrate 1, an anode 2 and a cathode 6 both formed on the glass substrate 1, and a hole transporting layer 3 and a red light emitting layer 4 both sandwiched between the anode 2 and the cathode 6.

The organic EL device in accordance with the embodiment 11 was fabricated in the following steps. First, an ITO film was formed on the glass substrate 1 by sputtering so that the ITO film has a sheet resistance of 20 ohms per a unit area. The thus formed ITO film acted as the anode 2. Then, a film composed of N,N'-diphenyl-N-N-bis(1-naphthyl)-1,1'-biphenyl-4,4'-diaminie [03] was formed as the hole transporting layer 3 on the anode 2 by a thickness of 50 nm by vacuum evaporation. Then, a film was formed as the red light emitting layer 4 on the hole transporting layer 3 by a thickness of 50 nm by vacuum co-evaporation. This film was composed of the quinolinol family metal complex [1] and the compound X3 at a weight ratio of 20:1. Then, a film composed of magnesium-silver alloy was formed as the cathode 6 on the red light emitting layer 4 by a thickness of 200 nm by vacuum evaporation. Thus, there was completed the organic EL device in accordance with the embodiment 11.

A direct current voltage of 10V was applied across the anode 2 and the cathode 6 of the thus fabricated organic EL device. As a result, there was obtained red light-emission of 700 cd/m$^2$.

[Embodiment 12]

The same steps as the steps carried out in the above-mentioned embodiment 11 were carried out except that the hole transporting layer 3 was composed of N,N'-diphenyl-N,N-bis(3-methylphenyl)-1,1'-biphenyl-4,4'-diamine [02], and that the red light emitting layer 4 was formed of the quinolinol family metal complex [13] and the compound X3 at a weight ratio of 20:1 by vacuum co-evaporation, to thereby fabricate an organic EL device in accordance with embodiment 12.

A direct current voltage of 10V was applied across the anode 2 and the cathode 6 of the thus fabricated organic EL device. As a result, there was obtained red light-emission of 860 cd/m$^2$.

[Embodiment 13]

The same steps as the steps carried out in the above-mentioned embodiment 11 were carried out except that the hole transporting layer 3 was composed of the compound X3, and that the red light emitting layer 4 was composed of the quinolinol family metal complex [13], to thereby fabricate an, organic EL device in accordance with embodiment 13.

A direct current voltage of 10V was applied across the anode 2 and the cathode 6 of the thus fabricated organic EL device. As a result, there was obtained red light-emission of 720 cd/m$^2$.

Hereinbelow are explained embodiments of an organic EL device including an organic layer containing a compound represented with the chemical formula C2.

SYNTHESIS EXAMPLE 1

Synthesis of Compound Y1 (bisanthrene)

There was carried out cyclization in a conventional manner, employing 9,10,9',10'-tetrahydrobisansryl with iodine being used as a catalyst, to thereby obtain bisanthrene.

SYNTHESIS EXAMPLE 2

Synthesis of Compound Y2 (4-di-p-tolylaminobisanthrene).

First, bisanthrene was dissolved in chloroform to thereby have first solution. Then, chloroform solution in which one equivalent of N-bromosuccinimide was dissolved was added to the first solution, to thereby have second solution. The second solution stood still for reaction at a room temperature for four hours. Then, the resultant was refined in a conventional manner to thereby have 4-bromobisanthrene.

Then, di-p-tolylamine, potassium carbonate, and copper powder were mixed to the thus obtained 4-bromobisanthrene. The mixture stood still for reaction at 200 degrees centigrade for 30 hours. After the resultant solution was diluted with water, reactant was extracted by chloroform. Thereafter, the thus obtained reactant was refined in a conventional manner to thereby obtain 4-di-p-tolylaminobisanthrene.

SYNTHESIS EXAMPLE 3

Synthesis of Compound Y3 (4,11-bis(di-p-tolylamino)bisanthrene)

First, bisanthrene was dissolved in chloroform to thereby have first solution. Then, chloroform solution in which two equivalents of N-bromosuccinimide was dissolved was added to the first solution, to thereby have second solution. The second solution stood still for reaction at a room temperature for four hours. Then, the resultant was refined in a conventional manner to thereby have 4,11-dibromobisanthrene.

Then, two equivalents of di-p-tolylamine, potassium carbonate, and copper powder were mixed to the thus obtained 4,11-dibromobisanthrene. The mixture stood still for reaction at 200 degrees centigrade for 30 hours. After the resultant solution was diluted with water, reactant was extracted by chloroform. Thereafter, the thus obtained reactant was refined in a conventional manner to thereby obtain 4,11-bis(di-p-tolylamino)bisanthrene.

SYNTHESIS EXAMPLE 4

Synthesis of Compound Y4 (4,11-bis(4-(4-methylphenylvinyl)phenyl-p-tolylamino)bisanthrene)

First, bisanthrene was dissolved in chloroform to thereby have first solution. Then, chloroform solution in which two equivalents of N-bromosuccinimide was dissolved was added to the first solution, to thereby have second solution. The second solution stood still for reaction at a room temperature for four hours. Then, the resultant was refined in a conventional manner to thereby have 4,11-dibromobisanthrene.

Then, two equivalents of phenyl-p-tolylamine, potassium carbonate, and copper powder were mixed to the thus obtained 4,11-dibromobisanthrene. The mixture stood still for reaction at 200 degrees centigrade for 30 hours. After the resultant solution was diluted with water, reactant was extracted by chloroform. Thereafter, the thus obtained reactant was refined in a conventional manner to thereby obtain 4,11-bisphenyl-p-tolylamino)bisanthrene.

The thus obtained 4,11-bis(phenyl-p-tolylamino) bisanthrene, pmethylbenzylphosphonic acid diethylester, and hydrogenated sodium were reacted with one another a day in dimethylsulfoxyde. The reactant liquid was poured into water with ice, and then, reactant was extracted by chloroform.

Then, the resultant was refined in a conventional manner to thereby have 4,11-bis(4-(4-methylphenylvinyl)phenyl-p-tolylamino)bisanthrene.

SYNTHESIS EXAMPLE 5

Synthesis of Compound Y5 (4,11-diphenylbisanthrene)

The same steps as the steps carried out in the above-mentioned Synthesis Example 1 were carried out except that 10,10'-diphenyl-9,10,9',10'-tetrahydrobisansryl was used in place of 9,10,9',10'-tetrahydrobisansryl, to thereby obtain 4,11-diphenylbisanthrene.

In the later mentioned embodiments 1 to 14, a red light emitting layer includes the compound represented with the chemical formula C2. In the embodiments 15 to 17, a red light emitting layer includes a thin film composed of both the compound represented with the chemical formula C2 and a hole transporting material. In the embodiments 18 and 19, a red light emitting layer includes a thin film composed of both the compound represented with the chemical formula C2 and an electron transporting material. In the embodiments 20 to 23, a hole transporting layer includes the compound represented with the chemical formula C2.

[Embodiment 1]

An organic EL device in accordance with the embodiment 1 has a cross-section as illustrated in FIG. 1. That is, the organic EL device in accordance with the embodiment 1 is comprised of a glass substrate 1, an anode 2 and a cathode 6 formed on the glass substrate 1, and a red light emitting layer 4 sandwiched between the anode 2 and the cathode 6.

The organic EL device in accordance with the embodiment 1 was fabricated in the following steps. First, an ITO film was formed on the glass substrate 1 by sputtering so that the ITO film has a sheet resistance of 20 ohms per a unit area. The thus formed ITO film was used as the anode 2. Then, the red light emitting layer 4 composed of the above-mentioned compound Y1 was formed on the anode 2 by a thickness of 40 nm by vacuum evaporation. Then, a magnesium-silver alloy film was formed as the cathode 6 on the red light emitting layer 4 by a thickness of 200 nm by vacuum evaporation. Thus, there was completed the organic EL device in accordance with the embodiment 1.

A direct current voltage of 5V was applied across the anode 2 and the cathode 6 of the thus fabricated organic EL device. As a result, there was obtained red light-emission of 50 cd/m$^2$.

[Embodiment 2]

The same steps as the steps carried out in the above-mentioned embodiment 1 were carried out except that the red light emitting layer 4 was composed of the compound Y2, to thereby fabricate an organic EL device in accordance with embodiment 2.

A direct current voltage of 5V was applied across the anode 2 and the cathode 6 of the thus fabricated organic EL device. As a result, there was obtained red light-emission of 60 cd/m$^2$.

[Embodiment 3]

The same steps as the steps carried out in the above-mentioned embodiment 1 were carried out except that the red light emitting layer 4 was composed of the compound Y3, to thereby fabricate an organic EL device in accordance with embodiment 3.

A direct current voltage of 5V was applied across the anode 2 and the cathode 6 of the thus fabricated organic EL device. As a result, there was obtained red light-emission of 80 cd/m$^2$.

[Embodiment 4]

The same steps as the steps carried out in the above-mentioned embodiment 1 were carried out except that the red light emitting layer 4 was composed of the compound Y4, to thereby fabricate an organic EL device in accordance with embodiment 4.

A direct current voltage of 5V was applied across the anode 2 and the cathode 6 of the thus fabricated organic EL device. As a result, there was obtained red light-emission of 100 cd/m$^2$.

[Embodiment 5]

The same steps as the steps carried out in the above-mentioned embodiment 1 were carried out except that the red light emitting layer 4 was composed of the compound Y5, to thereby fabricate an organic EL device in accordance with embodiment 5.

A direct current voltage of 5V was applied across the anode 2 and the cathode 6 of the thus fabricated organic EL device. As a result, there was obtained red light-emission of 40 cd/m$^2$.

[Embodiment 6]

An organic EL device in accordance with the embodiment 6 has the same cross-section as the cross-section of the organic EL device in accordance with the embodiment 1, illustrated in FIG. 1. Hereinbelow are explained steps of fabricating the organic EL device in accordance with the embodiment 6.

First, an ITO film was formed on the glass substrate 1 by sputtering so that the ITO film has a sheet resistance of 20 ohms per a unit area. The thus formed ITO film was used as the anode 2. Then, the red light emitting layer 4 was formed on the anode 2 by a thickness of 40 nm by spin coating in which chloroform solution containing the above-mentioned compound Y4 dissolved therein was used. Then, a magnesium-silver alloy film was formed as the cathode 6 on the red light emitting layer 4 by a thickness of 200 nm by vacuum evaporation. Thus, there was completed the organic EL device in accordance with the embodiment 6.

A direct current voltage of 5V was applied across the anode 2 and the cathode 6 of the thus fabricated organic EL device. As a result, there was obtained red light-emission of 70 cd/m$^2$.

[Embodiment 7]

FIG. 2 illustrates a cross-section of an organic EL device in accordance with the embodiment 7. The organic EL device in accordance with the embodiment 7 is comprised of a glass substrate 1, an anode 2 and a cathode 6 both. formed on the glass substrate 1, and a hole transporting layer 3, a red light; emitting layer 4, and an electron transporting layer 5 all sandwiched between the anode 2 and the cathode 6.

The organic EL device in accordance with the embodiment 7 was fabricated in the following steps. First, an ITO film was formed on the glass substrate 1 by sputtering so that the ITO film has a sheet resistance of 20 ohms per a unit area. The thus formed ITO film was used as the anode 2. Then, a film composed of N,N'-diphenyl-N,N'-bis(3-methylphenyl)-1,1'-biphenyl-4,4'-diamine [02] was formed as the hole transporting layer 3 on the anode 2 by a thickness of 50 nm by vacuum evaporation. Then, the red light emitting layer 4 composed of the above-mentioned compound Y1 was formed on the hole transporting layer 3 by a thickness of 40 nm by vacuum evaporation. Then, a film composed of 2-(4-biphenyl)-5-(4-t-butylphenyl)-1,3,4-oxadiazole [07] was formed as the electron transporting layer 5 on the red light emitting layer 4 by a thickness of 20 nm by vacuum evaporation. Then, a film composed of magnesium-silver alloy was formed as the cathode 6 on the electron transporting layer 5 by a thickness of 200 nm by vacuum evaporation. Thus, there was completed the organic EL device in accordance with the embodiment 7.

A direct current voltage of 10V was applied across the anode 2 and the cathode 6 of the thus fabricated organic EL device. As a result, there was obtained red light-emission of 700 cd/m$^2$.

[Embodiment 8]

The same steps as the steps carried out in the above-mentioned embodiment 7 were carried out except that the red light emitting layer 4 was composed of the compound Y2, to thereby fabricate an organic EL device in accordance with embodiment 8.

A direct current voltage of 10V was applied across the anode 2 and the cathode 6 of the thus fabricated organic EL device. As a result, there was obtained red light-emission of 1000 cd/m$^2$.

[Embodiment 9]

The same steps as the steps carried out in the above-mentioned embodiment 7 were carried out except that the red light emitting layer 4 was composed of the compound Y3, to thereby fabricate an organic EL device in accordance with embodiment 8.

A direct current voltage of 10V was applied across the anode 2 and the cathode 6 of the thus fabricated organic EL device. As a result, there was obtained red light-emission of 1500 cd/m$^2$.

[Embodiment 10]

The same steps as the steps carried out in the above-mentioned embodiment 7 were carried out except that the red light emitting layer 4 was composed of the compound Y4, to thereby fabricate an organic EL device in accordance with embodiment 10.

A direct current voltage of 10V was applied across the anode 2 and the cathode 6 of the thus fabricated organic EL device. As a result, there was obtained red light emission of 2500 cd/m$^2$.

[Embodiment 11]

The same steps as the steps carried out in the above-mentioned embodiment 7 were carried out except that the red light emitting layer 4 was composed of the compound Y5, to thereby fabricate an organic EL device in accordance with embodiment 11.

A direct current voltage of 10V was applied across the anode 2 and the cathode 6 of the thus fabricated organic EL device. As a result, there was obtained red light emission of 1400 cd/m$^2$.

[Embodiment 12]

The same steps as the steps carried out in the above-mentioned embodiment 7 were carried out except that the hole transporting layer 3 was composed of N,N'-diphenyl-N-N-bis(1-naphthyl)-1,1'-biphenyl-4,4'-diamine [03], and that the electron transporting layer 5 was composed of bis{2-(4-t-butylphenyl)-1,3,4-oxadiazole}-m-phenylene [08], to thereby fabricate an organic EL device in accordance with embodiment 12.

A direct current voltage of 10V was applied across the anode 2 and the cathode 6 of the thus fabricated organic EL device. As a result, there was obtained red light emission of 1500 cd/m$^2$.

[Embodiment 13]

The same steps as the steps carried out in the above-mentioned embodiment 7 were carried out except that the hole transporting layer 3 was composed of the above-mentioned star burst type molecules [04], that the red light emitting layer 4 was composed of the compound Y3, and that the electron transporting layer 5 was composed of the above-mentioned quinolinol family metal complex [11], to thereby fabricate an organic EL device in accordance with embodiment 13.

A direct current voltage of 10V was applied across the anode 2 and the cathode 6 of the thus fabricated organic EL device. As a result, there was obtained red light emission of 2000 cd/m$^2$.

[Embodiment 14]

The same steps as the steps carried out in the above-mentioned embodiment 7 were carried out except that the hole transporting layer 3 was composed of the above-mentioned star burst type molecules [05], that the red light emitting layer 4 was composed of the compound Y4, and that the electron transporting layer 5 was composed of the above-mentioned quinolinol family metal complex [12], to thereby fabricate an organic EL device in accordance with embodiment 14.

A direct current voltage of 10V was applied across the anode 2 and the cathode 6 of the thus fabricated organic EL device. As a result, there was obtained red light emission of 3000 cd/m$^2$.

[Embodiment 15]

FIG. 3 illustrates a cross-section of an organic EL device in accordance with the embodiment 15. The organic EL device in accordance with the embodiment 15 is comprised of a glass substrate 1, an anode 2 and a cathode 6 both formed on the glass substrate 1, and a red light emitting layer 4 and an electron transporting layer 5 both sandwiched between the anode 2 and the cathode 6.

The organic EL device in accordance with the embodiment 15 was fabricated in the following steps. First, an ITO film was formed on the glass substrate 1 by sputtering so that the ITO film has a sheet resistance of 20 ohms per a unit area. The thus formed ITO film was used as the anode 2. Then, a thin film was formed as the red light emitting layer 4 on the anode 2 by a thickness of 50 nm by co-evaporation. This thin film was composed of both N,N'-diphenyl-N-N-bis(1-naphthyl)-1,1'-biphenyl-4,4'-diamine [03] and the above-mentioned compound Y1 at a weight ratio of 1:10. Then, a film composed of triazole derivative [09] was formed as the electron transporting layer 5 on the red light emitting layer 4 by a thickness of 50 nm by vacuum evaporation. Then, a magnesium-silver alloy film was formed as the cathode 6 on the electron transporting layer 5 by a thickness of 200 nm by vacuum evaporation. Thus, there was completed the organic EL device in accordance with the embodiment 15.

A direct current voltage of 10V was applied across the anode 2 and the cathode 6 of the thus fabricated organic EL device. As a result, there was obtained red light emission of 700 cd/m$^2$.

[Embodiment 16]

The same steps as the steps carried out in the above-mentioned embodiment 15 were carried out except that the compound Y3 was used in place of the compound Y1, to thereby fabricate an organic EL device in accordance with embodiment 16.

A direct current voltage of 10V was applied across the anode 2 and the cathode 6 of the thus fabricated organic EL device. As a result, there was obtained red light emission of 1700 cd/m$^2$.

[Embodiment 17]

An organic EL device in accordance with the embodiment 17 has the same cross-section as the cross-section of the organic EL device in accordance with the embodiment 15, illustrated in FIG. 3. Hereinbelow are explained steps of fabricating the organic EL device in accordance with the embodiment 17.

First, an ITO film was formed on the glass substrate 1 by sputtering so that the ITO film has a sheet resistance of 20 ohms per a unit area. The thus formed ITO film was used as the anode 2. Then, a thin film was formed as the red light emitting layer 4 on the anode 2 by a thickness of 40 nm by spin coating in which chloroform solution containing the above-mentioned compound Y2 and N,N'-diphenyl-N-N-bis(1-naphthyl)-1,1'-biphenyl-4,4'-diamine [03] at a mol ratio of 1:10 was used. Then, a film composed of triazole derivative [10] was formed as the electron transporting layer 5 on the red light emitting layer 4 by a thickness of 50 nm by vacuum evaporation. Then, a magnesium-silver alloy film was formed as the cathode 6 on the electron transporting layer 5 by a thickness of 200 nm by vacuum evaporation. Thus, there was completed the organic EL device in accordance with the embodiment 17.

A direct current voltage of 10V was applied across the anode 2 and the cathode 6 of the thus fabricated organic EL device. As a result, there was obtained red light emission of 1600 cd/m$^2$.

[Embodiment 18]

FIG. 4 illustrates a cross-section of an organic EL device in accordance with the embodiment 18. The organic EL device in accordance with the embodiment 18 is comprised of a glass substrate 1, an anode 2 and a cathode 6 both formed on the glass substrate 1, and a hole transporting layer 3 and a red light emitting layer 4 both sandwiched between the anode 2 and the cathode 6.

The organic EL device in accordance with the embodiment 18 was fabricated in the following steps. First, an ITO film was formed on the glass substrate 1 by sputtering so that the ITO film has a sheet resistance of 20 ohms per a unit area. The thus formed ITO film acted as the anode 2. Then, a film composed of N,N'-diphenyl-N-N-bis(1-naphthyl)-1,1'-biphenyl-4,4'-diamine [03] was formed as the hole transporting layer 3 on the anode 2 by a thickness of 50 nm by vacuum evaporation. Then, a film was formed as the red light emitting layer 4 on the hole transporting layer 3 by a thickness of 50 nm by vacuum co-evaporation. This film was composed of the quinolinol family metal complex [11] and the compound Y1 at a weight ratio of 20:1. Then, a film composed of magnesium-silver alloy was formed as the cathode 6 on the red light emitting layer 4 by a thickness of 200 nm by vacuum evaporation. Thus, there was completed the organic EL device in accordance with the embodiment 18.

A direct current voltage of 10V was applied across the anode 2 and the cathode 6 of the thus fabricated organic EL device. As a result, there was obtained red light emission of 1500 cd/m$^2$.

[Embodiment 19]

The same steps as the steps carried out in the above-mentioned embodiment 18 were carried out except that the red light emitting layer 4 was comprised of a 50 nm-thick film containing the quinolinol family metal complex [11] and the above-mentioned compound Y4, and formed by vacuum co-evaporation, to thereby fabricate an organic EL device in accordance with embodiment 19.

A direct current voltage of 10V was applied across the anode 2 and the cathode 6 of the thus fabricated organic EL device. As a result, there was obtained red light emission of 2200 cd/m$^2$.

[Embodiment 20]

The same steps as the steps carried out in the above-mentioned embodiment 18 were carried out except that the hole transporting layer 3 was composed of N,N'-diphenyl-N,N'-bis(3-methylphenyl)-[1,1'-biphenyl]-4,4'-diamine [02], and that the red light emitting layer 4 was comprised of a film containing both the quinolinol family metal complex [13] and the above-mentioned compound Y4 at a weight ratio of 20:1, and formed by vacuum co-evaporation, to thereby fabricate an organic EL device in accordance with embodiment 20.

A direct current voltage of 10V was applied across the anode 2 and the cathode 6 of the thus fabricated organic EL device. As a result, there was obtained red light emission of 1600 cd/m$^2$.

[Embodiment 21]

The same steps as the steps carried out in the above-mentioned embodiment 18 were carried out except that the compound Y2 was used in place of the compound Y1 for forming the hole transporting layer 3, and that the quinolinol family metal complex [13] was used in place of the quinolinol family metal complex [11] for forming the red light emitting layer 4, to thereby fabricate an organic EL device in accordance with embodiment 21.

A direct current voltage of 10V was applied across the anode 2 and the cathode 6 of the thus fabricated organic EL device. As a result, there was obtained red light emission of 500 cd/m$^2$.

[Embodiment 22]

The same steps as the steps carried out in the above-mentioned embodiment 21 were carried out except that the hole transporting layer 3 was composed of the above-mentioned compound Y3, to thereby fabricate an organic EL device in accordance with embodiment 22.

A direct current voltage of 10V was applied across the anode 2 and the cathode 6 of the thus fabricated organic EL device. As a result, there was obtained red light emission of 700 cd/m$^2$.

[Embodiment 23]

The same steps as the steps carried out in the above-mentioned embodiment 21 were carried out except that the hole transporting layer 3 was composed of the above-mentioned compound Y4, to thereby fabricate an organic EL device in accordance with embodiment 23.

A direct current voltage of 10V was applied across the anode 2 and the cathode 6 of the thus fabricated organic EL device. As a result, there was obtained red light emission of 900 cd/m$^2$.

Hereinbelow are explained embodiments of an organic EL device including an organic layer containing a compound represented with the chemical formula C3.

SYNTHESIS EXAMPLE 1

Synthesis of Compound Z1 (benzo[a]perylene)

In accordance with a conventional manner, 7,14-dioxo-7,14-dihydrobenzo[a]perylene was treated in zinc powder contained in pyridine, and then, treated in 80% acetic acid. The resultant was refined in a conventional manner to thereby obtain a target material, benzo[a]perylene

SYNTHESIS EXAMPLE 2

Synthesis of Compound Z2 (di-p-tolylaminobenzo[a]perylene)

Benzo[a]perylene was dissolved in carbon tetrachloride. One equivalent of bromine was mixed to the thus obtained solution while being cooled. The mixture stood still for reaction for four hours. Then, the mixture was refined in a conventional manner to thereby obtain bromobenzo[a]perylene.

Then, di-p-tolylamine, potassium carbonate, and copper power were added to the thus obtained bromobenzo[a]perylene. This mixture stood still for reaction at 200 degrees centigrade for thirty hours. After reactant solution was diluted with water, reactant was extracted by chloroform. Thereafter, the reactant was refined in a conventional manner to thereby obtain di-p-tolylaminobenzo[a]perylene.

SYNTHESIS EXAMPLE 3

Synthesis of Compound Z3 (bis(di-p-tolylamino)benzo[a]perylene)

Benzo[a]perylene was dissolved in carbon tetrachloride. Two equivalents of bromine was mixed to the thus obtained solution while being cooled. The mixture stood still for reaction for four hours. Then, the mixture was refined in a conventional manner to thereby obtain dibromobenzo[a]perylene.

Then, two equivalents of di-p-tolylamine, potassium carbonate, and copper power were added to the thus obtained dibromobenzo[a]perylene. This mixture stood still for reaction at 200 degrees centigrade for thirty hours. After reactant solution was diluted with water, reactant was extracted by chloroform. Thereafter, the reactant was refined in a conventional manner to thereby obtain bis(di-p-tolylamino)benzo[a]perylene.

SYNTHESIS EXAMPLE 4

Synthesis of Compound Z4 ((4-(4-methylphenylvinyl)phenyl-p-tolylamino)benzo[a]perylene)

First, there was obtained bromobenzo[a]perylene in the same manner as that of the above-mentioned Synthesis Example 3. Then, one equivalent of phenyl-p-tolylamine, potassium carbonate, and copper power were added to the thus obtained bromobenzo[a]perylene. This mixture stood still for reaction at 200 degrees centigrade for 30 hours. After reactant solution was diluted with water, reactant was extracted by chloroform. Thereafter, the reactant was refined in a conventional manner to thereby obtain phenyl-p-tolylaminobenzo[a]perylene.

The thus obtained phenyl-p-tolylaminobenzo[a]perylene was dissolved in toluene, to which oxy phosphorus chloride was further added. The thus obtained solution was stirred at a room temperature. Then, N-methylformanilide was dropped into the solution, and then, the solution was stirred at 50 degrees centigrade for 5 hours. After reaction was completed, the resultant was poured into cold water, and then, transferred into a separatory funnel. Then, the resultant toluene layer was washed with water a couple of times until the toluene layer became neutral.

After the resultant was dried with magnesium sulfate, solvent was removed. Then, the resultant was refined in a conventional manner to thereby obtain N-p-formylphenyl-N-tolylaminobenzo[a]perylene. The thus obtained N-p-formylphenyl-N-tolylaminobenzo[a]perylene, p-methylbenzyl phosphonic acid diethylester, and hydrogenated sodium were mixed with one another, and stood still for reaction a day in dimethylsufoxyd. After reactant solution was poured into cold water, reactant was extracted by chloroform. Thereafter, the reactant was refined in a conventional manner to thereby obtain 4-(4-methylphenylvinyl)phenyl-p-tolylamino)benzo[a]perylene.

SYNTHESIS EXAMPLE 5

Synthesis of Compound Z5 (bis(4-(4-methylphenylvinyl)phenyl-p-tolylamino)benzo[a]perylene)

The same steps as the steps carried out in the above-mentioned Synthesis Example 4 were carried out except that dibromobenzo[a]perylene was used in place of bromobenzo[a]perylene, and that two equivalents of phenyl-p-tolylamine was used in place of one equivalent of the same, to thereby obtain bis(4-(4-methylphenylvinyl)phenyl-p-tolylamino) benzo[a]perylene.

In the later mentioned embodiments 1 to 14, a red light emitting layer includes the benzoperylene compound represented with the chemical formula C3. In the embodiments 15 to 17, a red light emitting layer includes a thin film composed of both the benzoperylene compound represented with the chemical formula C3 and a hole transporting material. In the embodiments 18 to 20, a red light emitting layer includes a thin film composed of both the compound represented with the chemical formula C3 and an electron transporting material. In the embodiments 21 and 22, a hole transporting layer includes a thin film composed of both the compound represented with the chemical formula C3 and a hole transporting material. In the embodiment 23, an electron transporting layer includes a thin film composed of both the compound represented with the chemical formula C3 and an electron transporting material.

[Embodiment 1]

An organic EL device in accordance with the embodiment 1 has a cross-section as illustrated in FIG. 1. That is, the organic EL device in accordance with the embodiment 1 is comprised of a glass substrate 1, an anode 2 and a cathode 6 formed on the glass substrate 1, and a red light emitting layer 4 sandwiched between the anode 2 and the cathode 6.

The organic EL device in accordance with the embodiment 1 was fabricated in the following steps. First, an ITO film was formed on the glass substrate 1 by sputtering so that the ITO film has a sheet resistance of 20 ohms per a unit area. The thus formed ITO film was used as the anode 2. Then, the red light emitting layer 4 composed of the above-mentioned compound Z1 was formed on the anode 2 by a thickness of 40 nm by vacuum evaporation. Then, a magnesium-silver alloy film was formed as the cathode 6 on the red light emitting layer 4 by a thickness of 200 nm by vacuum evaporation. Thus, there was completed the organic EL device in accordance with the embodiment 1.

A direct current voltage of 5V was applied across the anode 2 and the cathode 6 of the thus fabricated organic EL device. As a result, there was obtained red light-emission of 30 cd/m$^2$.

[Embodiment 2]

The same steps as the steps carried out in the above-mentioned embodiment 1 were carried out except that the red light emitting layer 4 was composed of the compound Z2, to thereby fabricate an organic EL device in accordance with embodiment 2.

A direct current voltage of 5V was applied across the anode 2 and the cathode 6 of the thus fabricated organic EL device. As a result, there was obtained red light-emission of 70 cd/m$^2$.

[Embodiment 3]

The same steps as the steps carried out in the above-mentioned embodiment 1 were carried out except that the red light emitting layer 4 was composed of the compound Z3, to thereby fabricate an organic EL device in accordance with embodiment 3.

A direct current voltage of 5V was applied across the anode 2 and the cathode 6 of the thus fabricated organic EL device. As a result, there was obtained red light-emission of 100 cd/m$^2$.

[Embodiment 4]

The same steps as the steps carried out in the above-mentioned embodiment 1 were carried out except that the red light emitting layer 4 was composed of the compound Z4, to thereby fabricate an organic EL device in accordance with embodiment 4.

A direct current voltage of 5V was applied across the anode 2 and the cathode 6 of the thus fabricated organic EL device. As a result, there was obtained red light-emission of 120 cd/m$^2$.

[Embodiment 5]

The same steps as the steps carried out in the above-mentioned embodiment 1 were carried out except that the red light emitting layer 4 was composed of the compound Z5, to thereby fabricate an organic EL device in accordance with embodiment 5.

A direct current voltage of 5V was applied across the anode 2 and the cathode 6 of the thus fabricated organic EL device. As a result, there was obtained red light-emission of 140 cd/m$^2$.

[Embodiment 6]

An organic EL device in accordance with the embodiment 6 has the same cross-section as that of the organic EL device in accordance with the embodiment 1, illustrated in FIG. 1. Hereinbelow is explained steps of fabricating an organic EL device in accordance with the embodiment 6.

First, an ITO film was formed on the glass substrate 1 by sputtering so that the ITO film has a sheet resistance of 20 ohms per a unit area. The thus formed ITO film acted as the anode 2. Then, the red light emitting layer 4 was formed on the anode 2 by a thickness of 40 nm by spin coating in which chloroform solution containing the above-mentioned compound Z5 dissolved therein was used. Then, a magnesium-silver alloy film was formed as the cathode 6 on the red light emitting layer 4 by a thickness of 200 nm by vacuum evaporation. Thus, there was completed the organic EL device in accordance with the embodiment 6.

A direct current voltage of 5V was applied across the anode 2 and the cathode 6 of the thus fabricated organic EL device. As a result, there was obtained red light-emission of 70 cd/m$^2$.

[Embodiment 7]

FIG. 2 illustrates a cross-section of an organic EL device in accordance with the embodiment 7. The organic EL device in accordance with the embodiment 7 is comprised of a glass substrate 1, an anode 2 and a cathode 6 both formed on the glass substrate 1, and a hole transporting layer 3, a red light emitting layer 4, and an electron transporting layer 5 all sandwiched between the anode 2 and the cathode 6.

The organic EL device in accordance with the embodiment 7 was fabricated in the following steps. First, an ITO film was formed on the glass substrate 1 by sputtering so that the ITO film has a sheet resistance of 20 ohms per a unit area. The thus formed ITO film acted as the anode 2. Then, a film composed of N,N'-diphenyl-N,N'-bis(3-methylphenyl)-1,1'-biphenyl-4,4'-diamine [02] was formed as the hole transporting layer 3 on the anode 2 by a thickness of 50 nm by vacuum evaporation. Then, the red light emitting layer 4 composed of the above-mentioned compound Z1 was formed on the hole transporting layer 3 by a thickness of 40 nm by vacuum evaporation. Then, a film composed of 2-(4-biphenyl)-5-(4-t-butylphenyl)-1,3,4-oxadiazole [07] was formed as the electron transporting layer 5 on the red light emitting layer 4 by a thickness of 20 nm by vacuum evaporation. Then, a film composed of magnesium-silver alloy was formed as the cathode 6 on the electron transporting layer 5 by a thickness of 200 nm by vacuum evaporation. Thus, there was completed the organic EL device in accordance with the embodiment 7.

A direct current voltage of 10V was applied across the anode 2 and the cathode 6 of the thus fabricated organic EL device. As a result, there was obtained red light-emission of 400 cd/m$^2$.

[Embodiment 8]

The same steps as the steps carried out in the above-mentioned embodiment 7 were carried out except that the red light emitting layer 4 was composed of the compound Z2, to thereby fabricate an organic EL device in accordance with embodiment 8.

A direct current voltage of 10V was applied across the anode 2 and the cathode 6 of the thus fabricated organic EL device. As a result, there was obtained red light-emission of 1200 cd/m$^2$.

[Embodiment 9]

The same steps as the steps carried out in the above-mentioned embodiment 7 were carried out except that the red light emitting layer 4 was composed of the compound Z3, to thereby fabricate an organic EL device in accordance with embodiment 9.

A direct current voltage of 10V was applied across the anode 2 and the cathode 6 of the thus fabricated organic EL device. As a result, there was obtained red light-emission of 1800 cd/m$^2$.

[Embodiment 10]

The same steps as the steps carried out in the above-mentioned embodiment 7 were carried out except that the red light emitting layer 4 was composed of the compound Z4, to thereby fabricate an organic EL device in accordance with embodiment 10.

A direct current voltage of 10V was applied across the anode 2 and the cathode 6 of the thus fabricated organic EL device. As a result, there was obtained red light-emission of 2000 cd/m$^2$.

[Embodiment 11]

The same steps as the steps carried out in the above-mentioned embodiment 7 were carried out except that the red light emitting layer 4 was composed of the compound Z5, to thereby fabricate an organic EL device in accordance with embodiment 11.

A direct current voltage of 10V was applied across the anode 2 and the cathode 6 of the thus fabricated organic EL device. As a result, there was obtained red light-emission of 2500 cd/m$^2$.

[Embodiment 12]

The same steps as the steps carried out in the above-mentioned embodiment 8 were carried out except that the hole transporting layer 3 was composed of N,N'-diphenyl-N-N-bis(1-naphthyl)-1,1'-biphenyl-4,4'-diamine [03], and that the electron transporting layer 5 was composed of bis{2-(4-t-butylphenyl)-1,3,4-oxadiazole}-m-phenylene [08], to thereby fabricate an organic EL device in accordance with embodiment 12.

A direct current voltage of 10V was applied across the anode 2 and the cathode 6 of the thus fabricated organic EL device. As a result, there was obtained red light-emission of 1700 cd/m$^2$.

[Embodiment 13]

The same steps as the steps carried out in the above-mentioned embodiment 7 were carried out except that the hole transporting layer 3 was composed of the above-mentioned star burst type molecules [04], that the red light emitting layer 4 was composed of the compound Z3, and that the electron transporting layer 5 was composed of the above-mentioned quinolinol family metal complex [11], to thereby fabricate an organic EL device in accordance with embodiment 13.

A direct current voltage of 10V was applied across the anode 2 and the cathode 6 of the thus fabricated organic EL device. As a result, there was obtained red light-emission of 2200 cd/m$^2$.

[Embodiment 14]

The same steps as the steps carried out in the above-mentioned embodiment 7 were carried out except that the hole transporting layer 3 was composed of the above-mentioned star burst type molecules [05], that the red light emitting layer 4 was composed of the compound Z5, and that the electron transporting layer 5 was composed of the above-mentioned quinolinol family metal complex [12], to thereby fabricate an organic EL device in accordance with embodiment 14.

A direct current voltage of 10V was applied across the anode 2 and the cathode 6 of the thus fabricated organic EL device. As a result, there was obtained red light-emission of 4000 cd/m$^2$.

[Embodiment 15]

FIG. 3 illustrates a cross-section of an organic EL device in accordance with the embodiment 15. The organic EL device in accordance with the embodiment 15 is comprised of a glass substrate 1, an anode 2 and a cathode 6 both formed on the glass substrate 1, and a red light emitting layer 4 and an electron transporting layer 5 both sandwiched between the anode 2 and the cathode 6.

The organic EL device in accordance with the embodiment 15 was fabricated in the following steps. First, an ITO film was formed on the glass substrate 1 by sputtering so that the ITO film has a sheet resistance of 20 ohms per a unit area. The thus formed ITO film acted as the anode 2. Then, a thin film was formed as the red light emitting layer 4 on the anode 2 by a thickness of 50 nm by co-evaporation. This thin film was composed of both N,N'-diphenyl-N-N-bis(1-naphthyl)-1,1'-biphenyl-4,4'-diamine [03] and the above-mentioned compound Z2 at a weight ratio of 1:10. Then, a film composed of triazole derivative [09] was formed as the electron transporting layer 5 on the red light emitting layer 4 by a thickness of 50 nm by vacuum evaporation. Then, a magnesium-silver alloy film was formed as the cathode 6 on the electron transporting layer 5 by a thickness of 200 nm by vacuum evaporation. Thus, there was completed the organic EL device in accordance with the embodiment 15.

A direct current voltage of 10V was applied across the anode 2 and the cathode 6 of the thus fabricated organic EL device. As a result, there was obtained red light-emission of 700 cd/m$^2$.

[Embodiment 16]

The same steps as the steps carried out in the above-mentioned embodiment 15 were carried out except that the red light emitting layer 4 was composed of the compound Z5 in place of the compound Z2, to thereby fabricate an organic EL device in accordance with embodiment 16.

A direct current voltage of 10V was applied across the anode 2 and the cathode 6 of the thus fabricated organic EL device. As a result, there was obtained red light-emission of 2000 cd/m$^2$.

[Embodiment 17]

An organic EL device in accordance with the embodiment 17 has the same cross-section as that of the organic EL device in accordance with the embodiment 15, illustrated in FIG. 3. Hereinbelow is explained steps of fabricating an organic EL device in accordance with the embodiment 17.

First, an ITO film was formed on the glass substrate 1 by sputtering so that the ITO film has a sheet resistance of 20 ohms per a unit area. The thus formed ITO film was used as the anode 2. Then, a thin film was formed as the red light emitting layer 4 on the anode 2 by a thickness of 40 nm by spin coating in which there was used chloroform solution containing the compound Z5 and N,N'-diphenyl-N-N-bis(1-naphthyl)-1,1'-biphenyl-4,4'-diamine [03] at a mol ratio of 1:10. Then, a film composed of triazole derivative [10] was formed as the electron transporting layer 5 on the red light emitting layer 4 by a thickness of 50 nm by vacuum evaporation. Then, a magnesium-silver alloy film was formed as the cathode 6 on the electron transporting layer 5 by a thickness of 200 nm by vacuum evaporation. Thus, there was completed the organic EL device in accordance with the embodiment 17.

A direct current voltage of 10V was applied across the anode 2 and the cathode 6 of the thus fabricated organic EL device. As a result, there was obtained red light-emission of 900 cd/m$^2$.

[Embodiment 18]

FIG. 4 illustrates a cross-section of an organic EL device in accordance with the embodiment 18. The organic EL device in accordance with the embodiment 18 is comprised of a glass substrate 1, an anode 2 and a cathode 6 both formed on the glass substrate 1, and a hole transporting layer 3 and a red light emitting layer 4 both sandwiched between the anode 2 and the cathode 6.

The organic EL device in accordance with the embodiment 18 was fabricated in the following steps. First, an ITO film was formed on the glass substrate 1 by sputtering so that the ITO film has a sheet resistance of 20 ohms per a unit area. The thus formed ITO film was used as the anode 2. Then, a film composed of N,N'-diphenyl-N-N-bis(1-naphthyl)-1,1'-biphenyl-4,4'-diamine [03] was formed as the hole transporting layer 3 on the anode 2 by a thickness of 50 nm by vacuum evaporation. Then, a film was formed as the red light emitting layer 4 on the hole transporting layer 3 by a thickness of 50 nm by vacuum co-evaporation. This film was composed of the quinolinol family metal complex [11] and the compound Z3 at a weight ratio of 20:1. Then, a film composed of magnesium-silver alloy was formed as the cathode 6 on the red light emitting layer 4 by a thickness of 200 nm by vacuum evaporation. Thus, there was completed the organic EL device in accordance with the embodiment 18.

A direct current voltage of 10V was applied across the anode 2 and the cathode 6 of the thus fabricated organic EL device. As a result, there was obtained red light-emission of 1400 cd/m$^2$.

[Embodiment 19]

The same steps as the steps carried out in the above-mentioned embodiment 18 were carried out except that the red light emitting layer 4 was formed of the quinolinol family metal complex [11] and the compound Z5 at a weight ratio of 20:1 by vacuum co-evaporation, to thereby fabricate an organic EL device in accordance with embodiment 19.

A direct current voltage of 10V was applied across the anode 2 and the cathode 6 of the thus fabricated organic EL device. As a result, there was obtained red light-emission of 2000 cd/m$^2$.

[Embodiment 20]

The same steps as the steps carried out in the above-mentioned embodiment 18 were carried out except that the hole transporting layer 3 was composed of N,N'-diphenyl-N,N'-bis(3-methylphenyl)-1,1'-biphenyl-4,4'-diamine [02], and that the red light emitting layer 4 was formed of the quinolinol family metal complex [13] and the compound Z5 at a weight ratio of 20:1 by vacuum co-evaporation, to thereby fabricate an organic EL device in accordance with embodiment 20.

A direct current voltage of 10V was applied across the anode 2 and the cathode 6 of the thus fabricated organic EL device. As a result, there was obtained red light-emission of 1800 cd/m$^2$.

[Embodiment 21]

The same steps as the steps carried out in the above-mentioned embodiment 7 were carried out except that the hole transporting layer 2 was composed of the compound Z4, and N,N'-diphenyl-N,N'-bis(3-methylphenyl)-1,1'-biphenyl-4,4'-diamine[02] to thereby fabricate an organic EL device in accordance with embodiment 21.

A direct current voltage of 10V was applied across the anode 2 and the cathode 6 of the thus fabricated organic EL device. As a result, there was obtained red light-emission of 500 cd/m$^2$.

[Embodiment 22]

The same steps as the steps carried out in the above-mentioned embodiment 21 were carried out except that the hole transporting layer 3 was composed of the compound Z5 and N,N'-diphenyl-N,N'-bis(3-methylphenyl)-1,1'-biphenyl-4,4'-diamine [02] to thereby fabricate an organic EL device in accordance with embodiment 22.

A direct current voltage of 10V was applied across the anode 2 and the cathode 6 of the thus fabricated organic EL device. As a result, there was obtained red light-emission of 700 cd/m$^2$.

[Embodiment 23]

The same steps as the steps carried out in the above-mentioned embodiment 7 were carried out except that the electron transporting layer 5 was composed of the compound Z1 and the quinolinol family metal complex [11], to thereby fabricate an organic EL device in accordance with embodiment 23.

A direct current voltage of 10V was applied across the anode 2 and the cathode 6 of the thus fabricated organic EL device. As a result, there was obtained red light-emission of 700 cd/m$^2$.

Hereinbelow are explained embodiments of an organic EL device including an organic layer containing a compound represented with the chemical formula C4.

SYNTHESIS EXAMPLE 1

Synthesis of Compound W1 (terylene)

In a conventional manner, 1,4-di-1-naphthylnaphthalene was gradually added to a liquid obtained by heating aluminum chloride and sodium chloride at 180 degrees centigrade to thereby melt. The obtained solution was stirred while heated. After reaction was completed, reactant solution was poured into hydrochloric acid. The reactant was filtered and washed with hot water to thereby obtain roughly refined terylene. Then, the thus obtained roughly refined terylene was refined in a conventional manner to thereby obtain a target material, terylene.

SYNTHESIS EXAMPLE 2

Synthesis of Compound W2 (di-p-tolylaminoterylene)

Terylene was dissolved in carbon tetrachloride. One equivalent of bromine was mixed to the thus obtained solution while being cooled. The mixture stood still for reaction for 4 hours. Then, the mixture was refined in a conventional manner to thereby obtain bromoterylene.

Then, di-p-tolylamine, potassium carbonate, and copper power were added to the thus obtained bromoterylene. This mixture stood still for reaction at 200 degrees centigrade for 30 hours. After reactant solution was diluted with water, reactant was extracted by chloroform. Thereafter, the reactant was refined in a conventional manner to thereby obtain di-p-tolylaminoterylene.

SYNTHESIS EXAMPLE 3

Synthesis of Compound W3 (bis(di-p-tolylamino)terylene)

Terylene was dissolved in carbon tetrachloride. Two equivalents of bromine were mixed to the thus obtained solution while being cooled. The mixture stood still for reaction for 4 hours. Then, the mixture was refined in a conventional manner to thereby obtain dibromoterylene.

Then, two equivalents of di-p-tolylamine, potassium carbonate, and copper power were added to the thus obtained dibromoterylene. This mixture stood still for reaction at 200 degrees centigrade for 30 hours. After reactant solution was diluted with water, reactant was extracted by chloroform. Thereafter, the reactant was refined in a conventional manner to thereby obtain bis(di-p-tolylamino)terylene.

SYNTHESIS EXAMPLE 4

Synthesis of Compound W4 ((4-(4-methylphenylvinyl)phenyl-p-tolylamino)terylene)

First, there was obtained bromoterylene in the same manner as that of the above-mentioned Synthesis Example 3. Then, one equivalent of phenyl-p-tolylamine, potassium carbonate, and copper power were added to the thus obtained bromoterylene. This mixture stood still for reaction at 200 degrees centigrade for 30 hours. After reactant solution was diluted with water, reactant was extracted by chloroform. Thereafter, the reactant was refined in a conventional manner to thereby obtain phenyl-p-tolylaminoterylene.

The thus obtained phenyl-p-tolylaminoterylene was dissolved in toluene, to which oxy phosphorus chloride was further added. The resultant solution was stirred at a room temperature. Then, N-methylformanilide was dropped into the solution, and then, the solution was stirred at 50 degrees centigrade for 5 hours. After reaction was completed, the resultant was poured into cold water, and then, transferred into a separatory funnel. Then, the resultant toluene layer was washed with water a couple of times until the toluene layer became neutral.

After the resultant was dried with magnesium sulfate, solvent was removed. Then, the resultant was refined in a conventional manner to thereby obtain N-p-formylphenyl-N-tolylaminoterylene. The thus obtained N-p-formylphenyl-N-tolylaminoterylene, p-methylbenzyl phosphonic acid diethylester, and hydrogenated sodium were mixed with one another, and stood still for reaction a day in dimethylsufoxyd. After reactant solution was poured into cold water, reactant was extracted by chloroform. Thereafter, the reactant was refined in a conventional manner to thereby obtain 4-(4-methylphenylvinyl)phenyl-p-tolylamino)terylene.

SYNTHESIS EXAMPLE 5

Synthesis of Compound W5 (bis(4-(4-methylphenylvinyl)phenyl-p-tolylamino)terylene)

The same steps as the steps carried out in the above-mentioned Synthesis Example 4 were carried out except that dibromoterylene was used in place of bromoterylene, and that two equivalents of phenyl-p-tolylamine was used in place of one equivalent of the same, to thereby obtain bis(4-(4-methylphenylvinyl)phenyl-p-tolylamino)terylene.

In the later mentioned embodiments 1 to 14, a red light emitting layer includes the compound represented with the chemical formula C4. In the embodiments 15 to 17, a red light emitting layer includes a thin film composed of both the compound represented with the chemical formula C4 and a hole transporting material. In the embodiments 18 to 20, a red light emitting layer includes a thin film composed of both the compound represented with the chemical formula C4 and an electron transporting material. In the embodiments 21 and 22, a hole transporting layer includes a thin film composed of the compound represented with the chemical formula C4. In the embodiment 23, an electron transporting layer includes a thin film composed of the compound represented with the chemical formula C4.

[Embodiment 1]

An organic EL device in accordance with the embodiment 1 has a cross-section as illustrated in FIG. 1. That is, the organic EL device in accordance with the embodiment 1 is comprised of a glass substrate 1, an anode 2 and a cathode 6 formed on the glass substrate 1, and a red light emitting layer 4 sandwiched between the anode 2 and the cathode 6.

The organic EL device in accordance with the embodiment 1 was fabricated in the following steps. First, an ITO film was formed on the glass substrate 1 by sputtering so that the ITO film has a sheet resistance of 20 ohms per a unit area. The thus formed ITO film was used as the anode 2. Then, the red light emitting layer 4 composed of the above-mentioned compound W1 was formed on the anode 2 by a thickness of 40 nm by vacuum evaporation. Then, a magnesium-silver alloy film was formed as the cathode 6 on the red light emitting layer 4 by a thickness of 200 nm by vacuum evaporation. Thus, there was completed the organic EL device in accordance with the embodiment 1.

A direct current voltage of 5V was applied across the anode 2 and the cathode 6 of the thus fabricated organic EL device. As a result, there was obtained red light-emission of 40 $cd/m^2$.

[Embodiment 2]

The same steps as the steps carried out in the above-mentioned embodiment 1 were carried out except that the red light emitting layer 4 was composed of the compound W2, to thereby fabricate an organic EL device in accordance with embodiment 2.

A direct current voltage of 5V was applied across the anode 2 and the cathode 6 of the thus fabricated organic EL device. As a result, there was obtained red light-emission of 60 cd/m$^2$.

[Embodiment 3]

The same steps as the steps carried out in the above-mentioned embodiment 1 were carried out except that the red light emitting layer 4 was composed of the compound W3, to thereby fabricate an organic EL device in accordance with embodiment 3.

A direct current voltage of 5V was applied across the anode 2 and the cathode 6 of the thus fabricated organic EL device. As a result, there was obtained red light-emission of 90 cd/m$^2$.

[Embodiment 4]

The same steps as the steps carried out in the above-mentioned embodiment 1 were carried out except that the red light emitting layer 4 was composed of the compound W4, to thereby fabricate an organic EL device in accordance with embodiment 4.

A direct current voltage of 5V was applied across the anode 2 and the cathode 6 of the thus fabricated organic EL device. As a result, there was obtained red light-emission of 110 cd/m$^2$.

[Embodiment 5]

The same steps as the steps carried out in the above-mentioned embodiment 1 were carried out except that the red light emitting layer 4 was composed of the compound W5, to thereby fabricate an organic EL device in accordance with embodiment 5.

A direct current voltage of 5V was applied across the anode 2 and the cathode 6 of the thus fabricated organic EL device. As a result, there was obtained red light-emission of 130 cd/m$^2$.

[Embodiment 6]

An organic EL device in accordance with the embodiment 6 has the same cross-section as that of the organic EL device in accordance with the embodiment 1, illustrated in FIG. 1. Hereinbelow is explained steps of fabricating an organic EL device in accordance with the embodiment 6.

First, an ITO film was formed on the glass substrate 1 by sputtering so that the ITO film has a sheet resistance of 20 ohms per a unit area. The thus formed ITO film acted as the anode 2. Then, the red light emitting layer 4 was formed on the anode 2 by a thickness of 40 nm by spin coating in which chloroform solution containing the above-mentioned compound W5 dissolved therein was used. Then, a magnesium-silver alloy film was formed as the cathode 6 on the red light emitting layer 4 by a thickness of 200 nm by vacuum evaporation. Thus, there was completed the organic EL device in accordance with the embodiment 6.

A direct current voltage of 5V was applied across the anode 2 and the cathode 6 of the thus fabricated organic EL device. As a result, there was obtained red light-emission of 60 cd/m$^2$.

[Embodiment 7]

FIG. 2 illustrates a cross-section of an organic EL device in accordance with the embodiment 7. The organic EL device in accordance with the embodiment 7 is comprised of a glass substrate 1, an anode 2 and a cathode 6 both formed on the glass substrate 1, and a hole transporting layer 3, a red light emitting layer 4 4, and an electron transporting layer 5 all sandwiched between the anode 2 and the cathode 6.

The organic EL device in accordance with the embodiment 7 was fabricated in the following steps. First, an ITO film was formed on the glass substrate 1 by sputtering so that the ITO film has a sheet resistance of 20 ohms per a unit area. The thus formed ITO film acted as the anode 2. Then, a film composed of N,N'-diphenyl-N,N'-bis(3-methylphenyl)-1,1'-biphenyl-4,4'-diamine [02] was formed as the hole transporting layer 3 on the anode 2 by a thickness of 50 nm by vacuum evaporation. Then, the red light emitting layer 4 composed of the above-mentioned compound W1 was formed on the hole transporting layer 3 by a thickness of 40 nm by vacuum evaporation. Then, a film composed of 2-(4-biphenyl)-5-(4-t-butylphenyl)-1,3,4-oxadiazole [07] was formed as the electron transporting layer 5 on the red light emitting layer 4 by a thickness of 20 nm by vacuum evaporation. Then, a film composed of magnesium-silver alloy was formed as the cathode 6 on the electron transporting layer 5 by a thickness of 200 nm by vacuum evaporation. Thus, there was completed the organic EL device in accordance with the embodiment 7.

A direct current voltage of 10V was applied across the anode 2 and the cathode 6 of the thus fabricated organic EL device. As a result, there was obtained red light-emission of 350 cd/m$^2$.

[Embodiment 8]

The same steps as the steps carried out in the above-mentioned embodiment 7 were carried out except that the red light emitting layer 4 was composed of the compound W2, to thereby fabricate an organic EL device in accordance with embodiment 8.

A direct current voltage of 10V was applied across the anode 2 and the cathode 6 of the thus fabricated organic EL device. As a result, there was obtained red light-emission of 1000 cd/m$^2$.

[Embodiment 9]

The same steps as the steps carried out in the above-mentioned embodiment 7 were carried out except that the red light emitting layer 4 was composed of the compound W3, to thereby fabricate an organic EL device in accordance with embodiment 9.

A direct current voltage of 10V was applied across the anode 2 and the cathode 6 of the thus fabricated organic EL device. As a result, there was obtained red light-emission of 1900 cd/m$^2$.

[Embodiment 10]

The same steps as the steps carried out in the above-mentioned embodiment 7 were carried out except that the red light emitting layer 4 was composed of the compound W4, to thereby fabricate an organic EL device in accordance with embodiment 10.

A direct current voltage of 10V was applied across the anode 2 and the cathode 6 of the thus fabricated organic EL device. As a result, there was obtained red light-emission of 2010 cd/m$^2$.

[Embodiment 11]

The same steps as the steps carried out in the above-mentioned embodiment 7 were carried out except that the red light emitting layer 4 was composed of the compound W5, to thereby fabricate an organic EL device in accordance with embodiment 11.

A direct current voltage of 10V was applied across the anode 2 and the cathode 6 of the thus fabricated organic EL device. As a result, there was obtained red light-emission of 2470 cd/m$^2$.

[Embodiment 12]

The same steps as the steps carried out in the above-mentioned embodiment 8 were carried out except that the hole transporting layer 3 was composed of N,N'-diphenyl-N-N-bis(1-naphthyl)-1,1'-biphenyl-4,4'-diamine [03], and that the electron transporting layer 5 was composed of bis{2-(4-t-butylphenyl)-1,3,4-oxadiazole}-m-phenylene

[08], to thereby fabricate an organic EL device in accordance with embodiment 12.

A direct current voltage of 10V was applied across the anode 2 and the cathode 6 of the thus fabricated organic EL device. As a result, there was obtained red light-emission of 1850 cd/m$^2$.

[Embodiment 13]

The same steps as the steps carried out in the above-mentioned embodiment 7 were carried out except that the hole transporting layer 3 was composed of the above-mentioned star burst type molecules [04], that the red light emitting layer 4 was composed of the compound W3, and that the electron transporting layer 5 was composed of the above-mentioned quinolinol family metal complex [11], to thereby fabricate an organic EL device in accordance with embodiment 13.

A direct current voltage of 10V was applied across the anode 2 and the cathode 6 of the thus fabricated organic EL device. As a result, there was obtained red light-emission of 2310 cd/m$^2$.

[Embodiment 14]

The same steps as the steps carried out in the above-mentioned embodiment 7 were carried out except that the hole transporting layer 3 was composed of the above-mentioned star burst type molecules [05], that the red light emitting layer 4 was composed of the compound W5, and that the electron transporting layer 5 was composed of the above-mentioned quinolinol family metal complex [12], to thereby fabricate an organic EL device in accordance with embodiment 14.

A direct current voltage of 10V was applied across the anode 2 and the cathode 6 of the thus fabricated organic EL device. As a result, there was obtained red light-emission of 3960 cd/m$^2$.

[Embodiment 15]

FIG. 3 illustrates a cross-section of an organic EL device in accordance with the embodiment 15. The organic EL device in accordance with the embodiment 15 is comprised of a glass substrate 1, an anode 2 and a cathode 6 both formed on the glass substrate 1, and a red light emitting layer 4 and an electron transporting layer 5 both sandwiched between the anode 2 and the cathode 6.

The organic EL device in accordance with the embodiment 15 was fabricated in the following steps. First, an ITO film was formed on the glass substrate 1 by sputtering so that the ITO film has a sheet resistance of 20 ohms per a unit area. The thus formed ITO film acted as the anode 2. Then, a thin film was formed as the red light emitting layer 4 on the anode 2 by a thickness of 50 nm by co-evaporation. This thin film was composed of both N,N'-diphenyl-N-N-bis(1-naphthyl)-1,1'-biphenyl-4,4'-diamine [03] and the above-mentioned compound W2 at a weight ratio of 1:10. Then, a film composed of triazole derivative [09] was formed as the electron transporting layer 5 on the red light emitting layer 4 by a thickness of 50 nm by vacuum evaporation. Then, a, magnesium-silver alloy film was formed as the cathode 6 on the electron transporting layer 5 by a thickness of 200 nm by vacuum evaporation. Thus, there was completed the organic EL device in accordance with the embodiment 15.

A direct current voltage of 10V was applied across the anode 2 and the cathode 6 of the thus fabricated organic EL device. As a result, there was obtained red light-emission of 710 cd/m$^2$.

[Embodiment 16]

The same steps as the steps carried out in the above-mentioned embodiment 15 were carried out except that the red light emitting layer 4 was composed of the compound W5 in place of the compound W2, to thereby fabricate an organic EL device in accordance with embodiment 16.

A direct current voltage of 10V was applied across the anode 2 and the cathode 6 of the thus fabricated organic EL device. As a result, there was obtained red light-emission of 2100 cd/m$^2$.

[Embodiment 17]

An organic EL device in accordance with the embodiment 17 has the same cross-section as that of the organic EL device in accordance with the embodiment 15, illustrated in FIG. 3. Hereinbelow is explained steps of fabricating an organic EL device in accordance with the embodiment 17.

First, an ITO film was formed on the glass substrate 1 by sputtering so that the ITO film has a sheet resistance of 20 ohms per a unit area. The thus formed ITO film was used as the anode 2. Then, a thin film was formed as the red light emitting layer 4 on the anode 2 by a thickness of 40 nm by spin coating in which there was used chloroform solution containing the compound W5 and N,N'-diphenyl-N-N-bis (1-naphthyl)-1,1'-biphenyl-4,4'-diamine [03] at a mol ratio of 1:10. Then, a film composed of triazole derivative [10] was formed as the electron transporting layer 5 on the red light emitting layer 4 by a thickness of 50 nm by vacuum evaporation. Then, a magnesium-silver alloy film was formed as the cathode 6 on the electron transporting layer 5 by a thickness of 200 nm by vacuum evaporation. Thus, there was completed the organic EL device in accordance with the embodiment 17.

A direct current voltage of 10V was applied across the anode 2 and the cathode 6 of the thus fabricated organic EL device. As a result, there was obtained red light-emission of 880 cd/m$^2$.

[Embodiment 18]

FIG. 4 illustrates a cross-section of an organic EL device in accordance with the embodiment 18. The organic EL device in accordance with the embodiment 18 is comprised of a glass substrate 1, an anode 2 and a cathode 6 both formed on the glass substrate 1, and a hole transporting layer 3 and a red light emitting layer 4 both sandwiched between the anode 2 and the cathode 6.

The organic EL device in accordance with the embodiment 18 was fabricated in the following steps. First, an ITO film was formed on the glass substrate 1 by sputtering so that the ITO film has a sheet resistance of 20 ohms per a unit area. The thus formed ITO film was used as the anode 2. Then, a film composed of N,N'-diphenyl-N-N-bis(1-naphthyl)-1,1'-biphenyl-4,4'-diamine [03] was formed as the hole transporting layer 3 on the anode 2 by a thickness of 50 nm by vacuum evaporation. Then, a film was formed as the red light emitting layer 4 on the hole transporting layer 3 by a thickness of 50 nm by vacuum co-evaporation. This film was composed of the quinolinol family metal complex [11] and the compound W3 at a weight ratio of 20:1. Then, a film composed of magnesium-silver alloy was formed as the cathode 6 on the red light emitting layer 4 by a thickness of 200 nm by vacuum evaporation. Thus, there was completed the organic EL device in accordance with the embodiment 18.

A direct current voltage of 10V was applied across the anode 2 and the cathode 6 of the thus fabricated organic EL device. As a result, there was obtained red light-emission of 1520 cd/m$^2$.

[Embodiment 19]

The same steps as the steps carried out in the above-mentioned embodiment 18 were carried out except that the red light emitting layer 4 was formed of the quinolinol family metal complex [11] and the compound W5 at a weight ratio of 20:1 by vacuum co-evaporation, to thereby fabricate an organic EL, device in accordance with embodiment 19.

A direct current voltage of 10V was applied across the anode 2 and the cathode 6 of the thus fabricated organic EL device. As a result, there was obtained red light-emission of 1800 cd/m².

[Embodiment 20]

The same steps as the steps carried out in the above-mentioned embodiment 18 were carried out except that the hole transporting layer 3 was composed of N,N'-diphenyl-N,N-bis(3-methylphenyl)-1,1'-biphenyl-4,4-diamine [02], and that the red light emitting layer 4 was formed of both the quinolinol family metal complex [13] and the compound W5 at a weight ratio of 20:1 by vacuum co-evaporation, to thereby fabricate an organic EL device in accordance with embodiment 20.

A direct current voltage of 10V was applied across the anode 2 and the cathode 6 of the thus fabricated organic EL device. As a result, there was obtained red light-emission of 1640 cd/m².

[Embodiment 21]

The same steps as the steps carried out in the above-mentioned embodiment 7 were carried out except that the hole transporting layer 3 was composed of the compound W4, and that the red light emitting layer 4 was composed of the quinolinol family metal complex [13], to thereby fabricate an organic EL device in accordance with embodiment 21.

A direct current voltage of 10V was applied across the anode 2 and the cathode 6 of the thus fabricated organic EL device. As a result, there was obtained red light-emission of 600 cd/m².

[Embodiment 22]

The same steps as the steps carried out in the above-mentioned embodiment 21 were carried out except that the hole transporting layer 3 was composed of the compound W5, to thereby fabricate an organic EL device in accordance with embodiment 22.

A direct current voltage of 10V was applied across the anode 2 and the cathode 6 of the thus fabricated organic EL device. As a result, there was obtained red light-emission of 870 cd/m².

[Embodiment 23]

The same steps as the steps carried out in the above-mentioned embodiment 7 were carried out except that the electron transporting layer 5 was composed of the compound W1, and that the red light emitting layer 4 was composed of the quinolinol family metal complex [11], to thereby fabricate an organic EL device in accordance with embodiment 23.

A direct current voltage of 10V was applied across the anode 2 and the cathode 6 of the thus fabricated organic EL device. As a result, there was obtained red light-emission of 100 cd/m².

As having been described with reference to the preferred embodiments, the organic EL device in accordance with the present invention is designed to include an organic thin layer 4 composed of the compound represented with the chemical formula C1, C2, C3 or C4, and hence, accomplish red light-emission at a higher brightness than a brightness of conventional organic EL devices.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 9-303047, 9-303048, 9-357022, and 10-886 filed on Nov. 5, 1997, Nov. 5, 1997, Dec. 25, 1997, and Jan. 6, 1998, respectively, each including specification, claims, drawings and summary is incorporated herein by reference in its entirety.

What is claimed is:

1. An electroluminescent device comprising:
   (a) an anode;
   (b) a cathode; and
   (c) at least one organic layer sandwiched between said anode and said cathode, said organic layer comprising a light emitting layer comprising a benzoperylene compound represented with the chemical formula C3, alone or in combination:

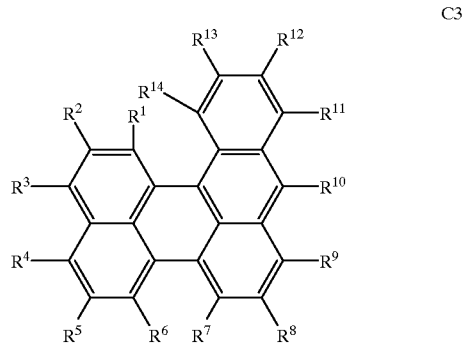

wherein $R^1$ and $R^{14}$ each independently represents a hydrogen atom, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a carboxyl group, and wherein any two of $R^2$ to $R^5$, $R^8$ to $R^{12}$, and $R^{14}$ may form a ring.

2. The organic electroluminescent device as set forth in claim 1, wherein said organic layer further comprises a hole transporting layer comprising said benzoperylene compound represented with said chemical formula C3, alone or in combination.

3. The organic electroluminescent device as set forth in claim 1, wherein said organic layer further comprises an electron transporting layer comprising said benzoperylene compound represented with said chemical formula C3, alone or in combination.

4. The organic electroluminescent device as set forth in claim 1, wherein at least one of $R^1$ to $R^{14}$ is a di-aryl amino group represented with —$NAr^1Ar^2$ where each of $Ar^1$ and $Ar^2$ independently indicates an aryl group having a carbon number of 6 to 20 both inclusive.

5. The organic electroluminescent device as set forth in claim 4, wherein at least one of said aryl groups has a substituent.

6. The organic electroluminescent device as set forth in claim 1, wherein at least one of $R^1$ to $R^{14}$ is a di-aryl amino group represented with —NAr$^1$Ar$^2$ where each of Ar$^1$ and Ar$^2$ independently indicates an aryl group having a carbon number of 6 to 20 both inclusive, and at least one of said Ar$^1$ and Ar$^2$ includes a substituted or unsubstituted styryl group as a substituent.

7. The organic electroluminescent device as set forth in claim 6, wherein at least one of said aryl groups has a substituent other than a substituted or unsubstituted styryl group.

8. The organic electroluminescent device as set forth in claim 1, wherein said anode has a work function equal to or greater than 4.5 eV.

9. The organic electroluminescent device as set forth in claim 8, wherein said cathode has a smaller work function than that of said anode.

10. The organic electroluminescent device as set forth in claim 1, wherein said organic layer has a thickness in the range of 1 nanometer to 1 micrometer both inclusive.

11. The organic electroluminescent device as set forth in claim 1, wherein said organic layer further comprises:

a hole transporting layer; and an electron transporting layer.

12. The organic electroluminescent device as set forth in claim 11, wherein said hole transporting layer comprises a triphenyl diamine.

13. The organic electroluminescent device as set forth in claim 11, wherein said electron transporting layer comprises a quinolinol family metal complex.

14. The organic electroluminescent device as set forth in claim 1, wherein said light emitting layer comprises a vacuum deposited layer.

15. The organic electroluminescent device as set forth in claim 1, wherein said light emitting layer has a thickness of about 40 nm.

16. The organic electroluminescent device as set forth in claim 1, wherein said light emitting layer further comprises a triphenyl diamine, and wherein a weight ratio of said triphenyl diamine to said benzoperylene compound represented with the chemical formula C3 is 1:10.

17. The organic electroluminescent device as set forth in claim 1, wherein light emitting layer further comprises a quinolinol family metal complex, and wherein a weight ratio of said quinolinol family metal complex to said benzoperylene compound represented with the chemical formula C3 is 20:1.

* * * * *